US012665593B2

(12) United States Patent
Khanna et al.

(10) Patent No.: US 12,665,593 B2
(45) Date of Patent: Jun. 23, 2026

(54) METHODS AND SYSTEMS OF OPERATING A DOUBLE-SIDED DOUBLE-BASE BIPOLAR JUNCTION TRANSISTOR

(71) Applicant: IDEAL POWER INC., Austin, TX (US)

(72) Inventors: Mudit Khanna, Austin, TX (US); Jiankang Bu, Austin, TX (US); Ruiyang Yu, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 4 days.

(21) Appl. No.: 18/795,582

(22) Filed: Aug. 6, 2024

(65) Prior Publication Data

US 2025/0112634 A1 Apr. 3, 2025

Related U.S. Application Data

(60) Provisional application No. 63/586,473, filed on Sep. 29, 2023.

(51) Int. Cl.
*H03K 17/66* (2006.01)
*H10D 30/00* (2025.01)
*H10D 64/23* (2025.01)

(52) U.S. Cl.
CPC ............. *H03K 17/66* (2013.01); *H10D 30/00* (2025.01); *H10D 64/231* (2025.01)

(58) Field of Classification Search
CPC ......... H03K 17/66; H01D 64/23; H01D 30/00
See application file for complete search history.

(56) References Cited

U.S. PATENT DOCUMENTS 3,299,369 A 1/1967 Vercellotti et al.
4,337,494 A 6/1982 Huykman
(Continued)

FOREIGN PATENT DOCUMENTS

EP 3913806 A1 11/2021
WO 9946809 A1 9/1999
WO 2014122472 A1 8/2014

OTHER PUBLICATIONS

Mojab, Alireza, et al., "Operation and Characterization of Low-Loss Bidirectional Bipolar Junction TRANsistor (B-Tran TM)", Applied Power Electronics Conference and Exposition (APEC), Mar. 2022, 5 pages, doi: 10.1109/APEC43599.2022.9773733.
(Continued)

*Primary Examiner* — Menatoallah Youssef
*Assistant Examiner* — Khareem E Almo
(74) *Attorney, Agent, or Firm* — Dickinson Wright PLLC

(57) ABSTRACT

Operating a double-sided double-base bipolar junction transistor. One example is a method of operating a switch assembly, the method comprising: blocking current flow from an upper terminal of the switch assembly to a lower terminal by a transistor; and then responsive to assertion of a conduction signal, conducting a first load current from the upper terminal to a lower terminal. The conducting the first load current may be by: closing an upper-main FET coupled between the upper terminal and an upper collector-emitter of the transistor; closing a lower-main FET coupled between a lower collector-emitter of the transistor and the lower terminal; driving a first turn-on current to an upper base of the transistor from an upper current source; and then providing a first steady-state current to the upper base from the upper current source, the first steady-state current lower than the first turn-on current.

14 Claims, 9 Drawing Sheets

(56) References Cited

U.S. PATENT DOCUMENTS

| | | | |
|---|---|---|---|
| 7,220,661 B1 | 5/2007 | Yu et al. | |
| 7,599,196 B2 | 10/2009 | Alexander | |
| 7,778,045 B2 | 8/2010 | Alexander | |
| 8,295,069 B2 | 10/2012 | Alexander | |
| 8,300,426 B2 | 10/2012 | Alexander | |
| 8,345,452 B2 | 1/2013 | Alexander | |
| 8,391,033 B2 | 3/2013 | Alexander | |
| 8,395,910 B2 | 3/2013 | Alexander | |
| 8,400,800 B2 | 3/2013 | Alexander | |
| 8,406,025 B1 | 3/2013 | Alexander | |
| 8,432,711 B1 | 4/2013 | Alexander | |
| 8,441,819 B2 | 5/2013 | Alexander | |
| 8,446,042 B2 | 5/2013 | Bundschuh et al. | |
| 8,446,745 B1 | 5/2013 | Alexander | |
| 8,451,637 B1 | 5/2013 | Alexander | |
| 8,461,718 B2 | 6/2013 | Bundschuh et al. | |
| 8,471,408 B2 | 6/2013 | Bundschuh et al. | |
| 8,514,601 B2 | 8/2013 | Alexander | |
| 8,531,858 B2 | 9/2013 | Alexander | |
| 9,007,796 B2 | 4/2015 | Alexander | |
| 9,029,909 B2 | 5/2015 | Blanchard et al. | |
| 9,035,350 B2 | 5/2015 | Blanchard et al. | |
| 9,042,131 B2 | 5/2015 | Barron et al. | |
| 9,054,706 B2 | 6/2015 | Blanchard et al. | |
| 9,054,707 B2 | 6/2015 | Blanchard et al. | |
| 9,059,710 B2 | 6/2015 | Blanchard et al. | |
| 9,077,185 B2 | 7/2015 | Alexander | |
| 9,118,247 B2 | 8/2015 | Alexander | |
| 9,130,461 B2 | 9/2015 | Alexander | |
| 9,159,819 B2 | 10/2015 | Pfirsch et al. | |
| 9,190,894 B2 | 11/2015 | Alexander et al. | |
| 9,203,400 B2 | 12/2015 | Alexander et al. | |
| 9,203,401 B2 | 12/2015 | Alexander et al. | |
| 9,209,713 B2 | 12/2015 | Alexander et al. | |
| 9,209,798 B2 | 12/2015 | Alexander et al. | |
| 9,231,582 B1 | 1/2016 | Alexander et al. | |
| 9,270,142 B2 | 2/2016 | Alexander | |
| 9,293,946 B2 | 3/2016 | Alexander | |
| 9,337,262 B2 | 5/2016 | Blanchard | |
| 9,355,353 B2 | 5/2016 | Von Mueller et al. | |
| 9,355,853 B2 | 5/2016 | Blanchard et al. | |
| 9,356,595 B2 | 5/2016 | Alexander et al. | |
| 9,444,449 B2 | 9/2016 | Alexander et al. | |
| 9,647,553 B2 | 5/2017 | Alexander et al. | |
| 9,742,385 B2 | 8/2017 | Alexander | |
| 9,742,395 B2 | 8/2017 | Alexander et al. | |
| 9,787,298 B2 | 10/2017 | Alexander et al. | |
| 9,818,615 B2 | 11/2017 | Blanchard et al. | |
| 9,899,932 B2 | 2/2018 | Alexander | |
| 10,056,372 B2 | 8/2018 | Alexander | |
| 10,211,283 B2 | 2/2019 | Alexander et al. | |
| 10,418,471 B2 | 9/2019 | Alexander et al. | |
| 10,497,699 B2 | 12/2019 | Alexander | |
| 10,580,885 B1 | 3/2020 | Alexander et al. | |
| 10,892,354 B2 | 1/2021 | Alexander et al. | |
| 11,069,797 B2 | 7/2021 | Blanchard et al. | |
| 11,411,557 B2 | 8/2022 | Mojab | |
| 11,496,129 B2 | 11/2022 | Mojab | |
| 11,522,051 B2 | 12/2022 | Mojab et al. | |
| 11,637,016 B2 | 4/2023 | Blanchard et al. | |
| 11,699,746 B2 | 7/2023 | Blanchard et al. | |
| 11,777,018 B2 | 10/2023 | Blanchard et al. | |
| 11,804,835 B2 | 10/2023 | Mojab | |
| 11,881,525 B2 | 1/2024 | Bu et al. | |
| 11,888,030 B2 | 1/2024 | Wood et al. | |
| 2005/0280155 A1 | 12/2005 | Lee | |
| 2012/0051100 A1 | 3/2012 | Alexander | |
| 2012/0279567 A1 | 11/2012 | Alexander | |
| 2013/0307336 A1 | 11/2013 | Bundschuh et al. | |
| 2013/0314096 A1 | 11/2013 | Bundschuh et al. | |
| 2014/0319911 A1 | 10/2014 | Alexander | |
| 2015/0061569 A1 | 3/2015 | Alexander et al. | |
| 2015/0214782 A1 | 7/2015 | Alexander | |
| 2015/0222146 A1 | 8/2015 | Alexander | |
| 2015/0222194 A1 | 8/2015 | Bundschuh | |
| 2015/0318704 A1 | 11/2015 | Barron et al. | |
| 2016/0322350 A1 | 11/2016 | Blanchard | |
| 2016/0322484 A1 | 11/2016 | Blanchard | |
| 2016/0344300 A1 | 11/2016 | Alexander | |
| 2017/0288561 A1 | 10/2017 | Lemberg et al. | |
| 2017/0317575 A1 | 11/2017 | Alexander | |
| 2018/0026122 A1 | 1/2018 | Blanchard et al. | |
| 2018/0109101 A1 | 4/2018 | Alexander | |
| 2018/0226254 A1 | 8/2018 | Blanchard et al. | |
| 2019/0140548 A1 | 5/2019 | Alexander | |
| 2019/0267810 A1 | 8/2019 | Johns | |
| 2020/0006945 A1 | 1/2020 | Lemberg et al. | |
| 2020/0076430 A1* | 3/2020 | Turkson | H03K 17/693 |
| 2021/0359678 A1* | 11/2021 | Mojab | H10D 62/177 |
| 2021/0384900 A1* | 12/2021 | Mojab | H02M 11/00 |
| 2022/0190115 A1* | 6/2022 | Mojab | H10D 62/177 |
| 2023/0386987 A1 | 11/2023 | Bu et al. | |
| 2024/0154029 A1* | 5/2024 | Brdar | H03K 17/04166 |
| 2024/0194736 A1 | 6/2024 | Bu et al. | |
| 2024/0396546 A1* | 11/2024 | Khanna | H03K 17/60 |

OTHER PUBLICATIONS

International Search Report and Written Opinion mailed Mar. 20, 2024 for International Application No. PCT/US2023/080216, 16 pages.

International Search Report and Written Opinion mailed Jul. 18, 2024 for International Application No. PCT/US2024/020909, 13 pages.

Dong, Mouzhi et al., "B-Tran ™ Optimization and Performance Characterization", Applied Power Electronics Conference and Exposition (APEC), Mar. 19, 2023, 5 pages.

International Search Report and Written Opinion mailed Nov. 4, 2024 for International Application No. PCT/US2024/041064, 12 pages.

* cited by examiner

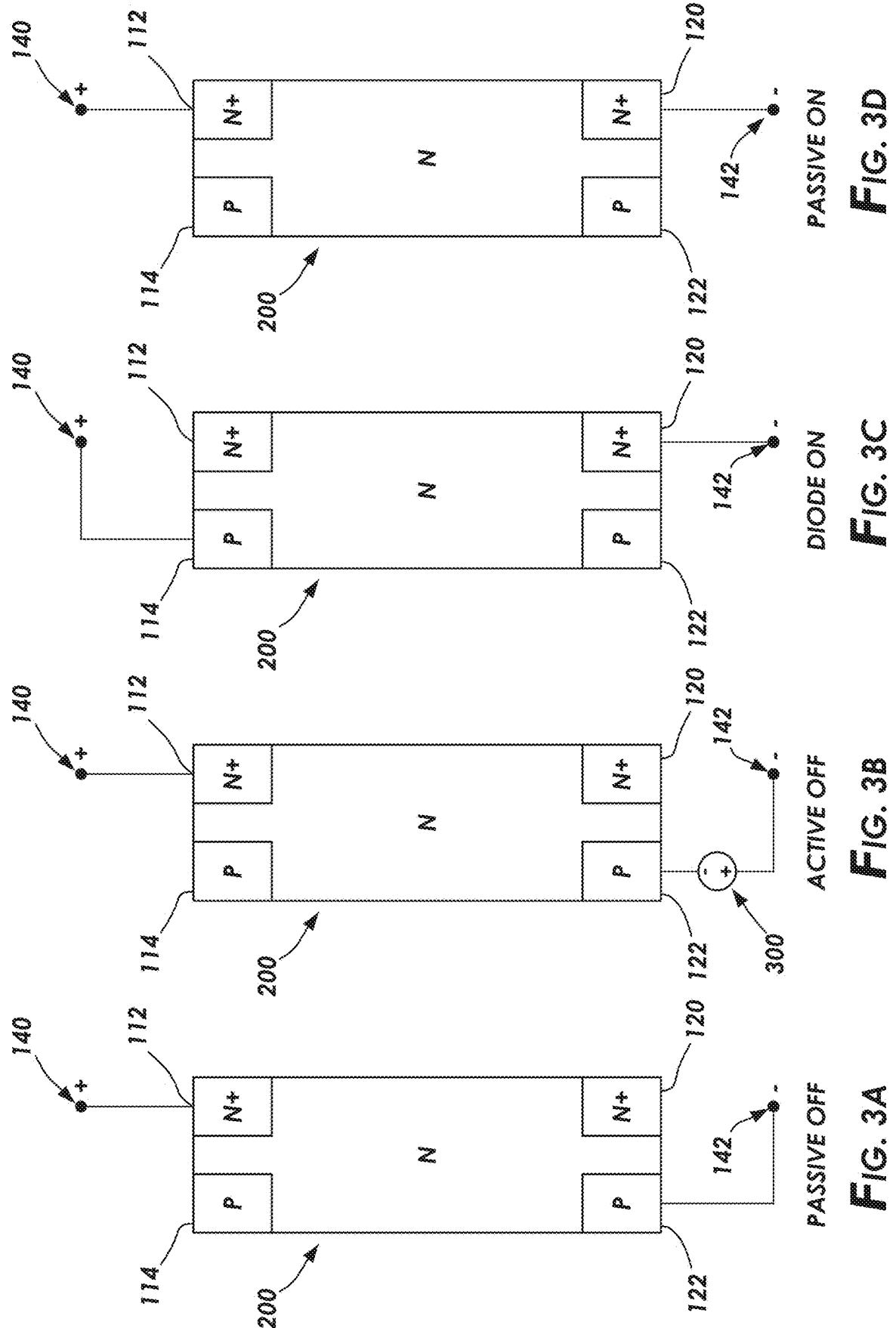
FIG. 3A  PASSIVE OFF
FIG. 3B  ACTIVE OFF
FIG. 3C  DIODE ON
FIG. 3D  PASSIVE ON

BI-DIRECTIONAL
BLOCKING

PRE-TURNOFF

ACTIVE ON

METHODS AND SYSTEMS OF OPERATING A DOUBLE-SIDED DOUBLE-BASE BIPOLAR JUNCTION TRANSISTOR

CROSS-REFERENCE TO RELATED APPLICATIONS

This application claims the benefit of U.S. Provisional Application No. 63/586,473 filed Sep. 29, 2023 and titled "Methods and Systems of Operating a Double-Sided Double-Base Bipolar Junction Transistor." The provisional application is incorporated by reference herein as if reproduced in full below.

BACKGROUND

A double-sided double-base (DSDB) bipolar junction transistor (BJT) is junction transistor constructed with a base and collector-emitter on a first side of the bulk region, and a distinct and separate base and collector-emitter on a second side of the bulk region, opposite the first side. When properly configured by an external driver, electrical current may selectively flow through the collector-emitters of the DSDB BJT in either direction, and thus such devices are considered bi-directional devices.

Any method or system that simplifies driving a DSDB BJT would provide a competitive advantage in the marketplace.

SUMMARY

At least one example is a method of operating a switch assembly, the method comprising: blocking current flow from an upper terminal of the switch assembly to a lower terminal of the switch assembly by a transistor; and then responsive to assertion of a conduction signal, conducting a first load current from the upper terminal to a lower terminal. The conducting the first load current from the upper terminal to the lower terminal may be by: closing an upper-main FET coupled between the upper terminal and an upper collector-emitter of the transistor; closing a lower-main FET coupled between a lower collector-emitter of the transistor and the lower terminal; driving a first turn-on current to an upper base of the transistor from an upper current source; and then providing a first steady-state current to the upper base from the upper current source, the first steady-state current lower than the first turn-on current.

The example method may further comprise interrupting the first load current by opening the lower-main FET, and then arranging the transistor to block current from the upper terminal to the lower terminal. The example method may further comprise: blocking current flow from the lower terminal to the upper terminal by the transistor; and then responsive to assertion of a conduction signal, conducting a second load current from the lower terminal to the upper terminal. The conducting the second load current from the lower terminal to the upper terminal may be by: closing the lower-main FET; closing the upper-main FET; driving a second turn-on current to a lower base of the transistor from a lower current source; and then providing a second steady-state current to the lower base from the lower current source, the second steady-state current lower than the second turn-on current. In some cases, the first steady-state current may be equal to the second steady-state current. Further still: driving the first turn-on current from the upper current source may comprise driving the first turn-on current from an upper power converter based on a first upper feedback derived from an output voltage of the upper power converter; providing the first steady-state current from the upper current source may comprise providing the first steady-state current from the upper power converter based on a second upper feedback derived from current provided by the upper power converter; driving the second turn-on current from the lower current source may comprise driving the second turn-on current from a lower power converter based on a first lower feedback derived from an output voltage of the lower power converter; and providing the second steady-state current from the lower current source may comprise providing the second steady-state current from the lower power converter based on a second lower feedback derived from current provided by the lower power converter. The example method may further comprise extracting energy for the first turn-on current and the first steady-state current from the upper terminal, and extracting energy for the second turn-on current and the second steady-state current from the upper terminal.

In the example method: driving the first turn-on current from the upper current source may comprise driving the first turn-on current from an upper power converter based on a first feedback derived from an output voltage of the upper power converter; and providing the first steady-state current from the upper power converter may comprise providing the first steady-state current from the upper power converter based on a second feedback derived from current provided by the upper power converter.

In the example method: driving the first turn-on current from the upper current source may comprise driving the first turn-on current from an upper power converter based on a first setpoint; and providing the first steady-state current from the upper current source comprises driving the first steady-state current from the upper power converter based on a second setpoint different than the first setpoint.

The example method may further comprise extracting energy for the first turn-on current and the first steady-state current from the upper terminal.

Yet another example is a switch assembly comprising: an upper terminal, and a lower terminal; a transistor defining an upper base, an upper collector-emitter, a lower base, and a lower collector-emitter; an upper current source having a sink input coupled to the upper terminal and a source output; an upper-main FET defining a first lead coupled to the upper terminal, a second lead coupled to the upper collector-emitter, and a gate; a lower-main FET defining a first lead coupled to the lower collector-emitter, a second lead coupled to the lower terminal, and a gate; and a controller coupled to the gate of the upper-main FET and the gate of the lower-main FET, and for a first applied voltage across the upper terminal and lower terminal. The controller may be configured to: assert the gate of the upper-main FET; assert the gate of the lower-main FET; and configure the upper current source to provide a first turn-on current to the upper base of the transistor, and then to provide a first steady-state current to the upper base, the first steady-state current lower than the first turn-on current.

The example switch assembly may further comprise: an upper-base FET defining a first lead coupled to the source output of the upper current source, a second lead coupled to the upper base, and a gate; the controller is coupled to the gate of the upper-base FET, and when the controller configures the upper current source, the controller is configured to assert the gate of the upper-base FET to couple the source output to the upper base.

The example switch assembly may further comprise, a lower current source having a sink input coupled to the lower terminal and a source output, and wherein, for a second applied voltage across the upper terminal and lower terminal, the second applied voltage of opposite polarity from the first applied voltage, the controller configured to: assert the gate of the lower-main FET; assert the gate of the upper-main FET; configure the lower current source to provide a second turn-on current to the lower base of the transistor, and then to provide a second steady-state current to the lower base, the second steady-state current lower than the second turn-on current. The switch assembly may further comprise: an upper-base FET defining a first lead coupled to the source output of the upper current source, a second lead coupled to the upper base, and a gate; a lower-base FET defining a first lead coupled to the source output of the lower current source, a second lead coupled to the lower base, and a gate. The controller may be coupled to the gate of the upper-base FET and the gate of the lower-base FET, and when the controller configures the upper current source, the controller may be configured to assert the gate of the upper-base FET to couple the source output of the upper current source to the upper base. And when the controller configures the lower current source, the controller may be configured to assert the gate of the lower-base FET to couple the source output of the lower current source to the lower base.

The example switch assembly may further comprise: a power source that defines an upper power rail and a lower power rail; the power converter configured to apply an upper rail voltage to the upper power rail, the upper rail voltage referenced to the upper terminal; and the power converter configured to apply a lower rail voltage to the lower power rail, the lower rail voltage referenced to the lower terminal. The power source may have a power input coupled to the upper terminal.

In the example switch assembly, the upper current source may be a switching power converter designed and constructed to control output current as the controlled variable during at least the providing of the first steady-state current. Further in the example switch assembly, the upper current source may be a switching power converter designed and constructed to control output current as the controlled variable during the providing of the first turn-on current and during the providing of the first steady-state current.

BRIEF DESCRIPTION OF THE DRAWINGS

For a detailed description of example embodiments, reference will now be made to the accompanying drawings in which:

FIGS. 3A-3G show a double-sided double-base bipolar junction transistor of PNP construction in shorthand form, with example external electrical connections, to illustrate several operational states;

DEFINITIONS

Figure 2:
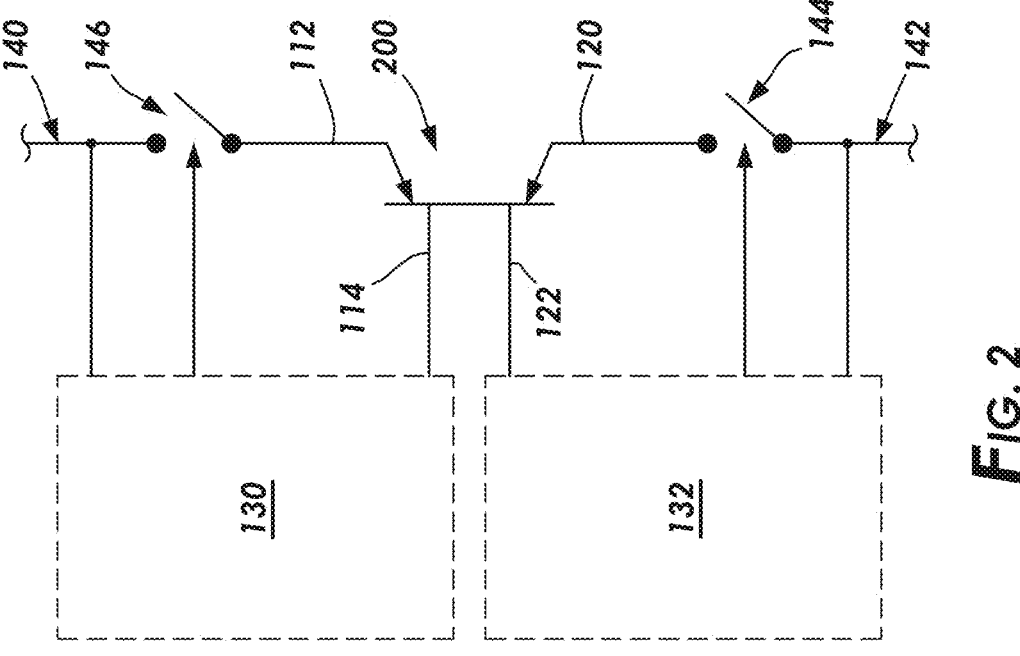
FIG. 2 shows a partial block diagram, partial electrical schematic, of a power module using a double-sided double-base bipolar junction transistor of PNP construction.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or a direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"Assert" shall mean creating or maintaining a first predetermined state of a Boolean signal. Boolean signals may be asserted high or with a higher voltage, and Boolean signals may be asserted low or with a lower voltage, at the discretion of the circuit designer. Similarly, "de-assert" shall mean creating or maintaining a second predetermined state of the Boolean, opposite the asserted state.

"FET" shall mean a field effect transistor, such as a junction-gate FET (JFET) or metal-oxide-silicon FET (MOSFET).

"Closing" in reference to an electrically-controlled switch (e.g., a FET) shall mean making the electrically-controlled switch conductive. For example, closing a FET used as an electrically-controlled switch may mean driving the FET to the fully conductive state.

"Opening" in reference to an electrically-controlled switch (e.g., a FET) shall mean making the electrically-controlled switch non-conductive. Leakage current shall not negate the status of an electrically-controlled switch being non-conductive.

"Collector-emitter" of a bipolar junction transistor shall mean a region of the bipolar junction transistor through which main load current flows. For purposes of this specification and claims, the designation as a collector-emitter is independent of the underlying device physics within the bipolar junction transistor. For example, for a double-sided double-base PNP transistor, the main load current may flow from an upper P-type region, through the bulk N-type region, and then out the lower P-type region, and when so used the upper P-type region and the lower P-type region are considered collector-emitters. However, in other cases, such as described in co-pending and commonly assigned U.S. App. 63/382,924 filed Nov. 9, 2022 and titled "Methods and Systems of Operating a PNP Bi-Directional Double-Base Bipolar Junction Transistor," the main load current may flow from an upper N-type region, through the bulk N-type region, and then through the lower N-type region, and when so used the upper and lower N-type regions are considered collector-emitters.

"Base" of a bipolar junction transistor shall mean a region of the bipolar junction transistor through which control current flows, the control current distinct from the main load current. For purposes of this specification and claims, the designation as a base is independent of the underlying device physics within the bipolar junction transistor. For example, for a double-sided double-base PNP transistor, the control current may flow into an upper N-type region or a lower N-type region, and when so used the upper N-type region and the lower N-type region are considered bases. However, in other cases, such as described in co-pending and commonly assigned U.S. App. 63/382,924 noted above, the control current may flow into an upper P-type region or a lower P-type region, and when so used the upper and lower P-type regions are considered bases.

"Upper" in reference to component (e.g., upper collector-emitter, upper base) shall not be read to imply a location of the recited component with respect to gravity. Upper may be derived from location of the device in an example drawing.

"Lower" in reference to a component (e.g., upper collector-emitter, upper base) shall not be read to imply a location of the recited component with respect to gravity. Lower may be derived from location of the device in an example drawing.

In the field of electrical engineering, the terms "voltage source" and "current source" are terms of art. Within a designed operating range, a "voltage source" provides a setpoint voltage regardless of current drawn by a downstream load. Within a designed operation range, a "current source" provides a setpoint current to a downstream load regardless of the voltage used to drive the current. Though a "voltage source" provides current, a "voltage source" operated to provide a setpoint voltage regardless of current drawn from the "voltage source" shall not be considered to be a "current source."

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Controller" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to methods and systems of operating a double-sided double-base bipolar junction transistor. One example is a method comprising blocking current flow from an upper terminal of a switch assembly to a lower terminal of the switch assembly by a transistor, and then responsive to assertion of a conduction signal, conducting a first load current from the upper terminal to a lower terminal. The conducting the first load current may be by: closing an upper-main FET coupled between the upper terminal and an upper collector-emitter of the transistor; closing a lower-main FET coupled between a lower collector-emitter of the transistor and the lower terminal; driving a first turn-on current to an upper base of the transistor from an upper current source; and then providing a first steady-state current to the upper base from the upper current source, the first steady-state current lower than the first turn-on current.

Figure 1:
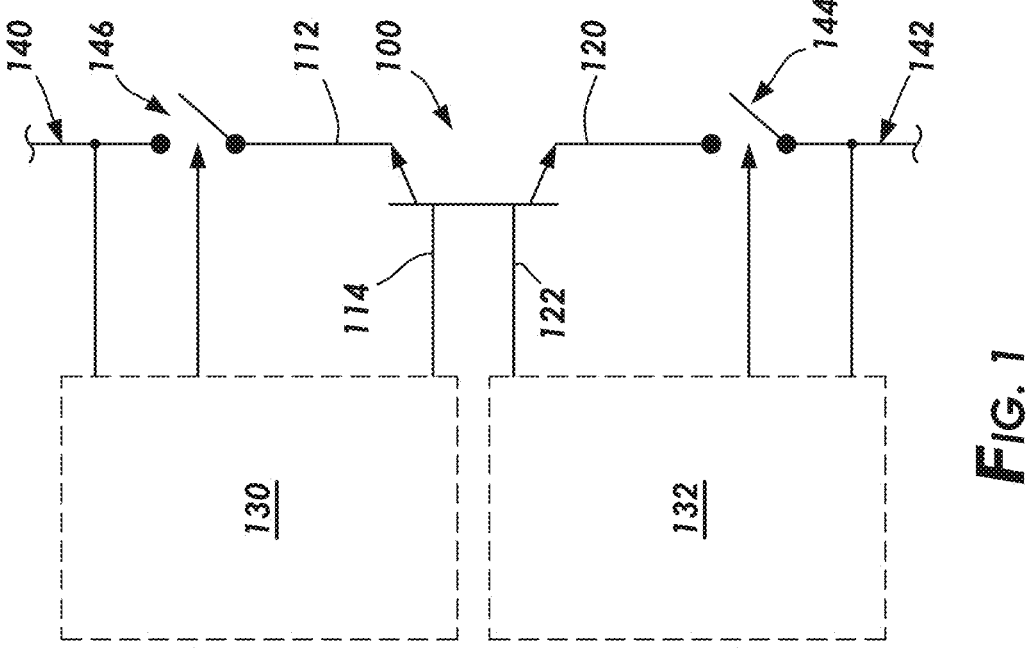
FIG. 1 shows a partial block diagram, partial electrical schematic, of a power module using a double-sided double-base bipolar junction transistor of NPN construction.

FIG. 1 shows a partial block diagram, partial electrical schematic, of a power module using double-sided double-base (DSDB) bipolar junction transistor (BJT) having an NPN construction. In particular, visible in FIG. 1 is a DSDB BJT 100 defining an upper collector-emitter 112, an upper base 114, a lower collector-emitter 120, and a lower base 122. An NPN construction is a normally off or normally non-conductive transistor. A driver circuit is used to arrange the example NPN device for selective conduction in either direction. In particular, the upper collector-emitter 112 and the upper base 114 may be associated with an upper driver 130, and the lower collector-emitter 120 and lower base may be associated with a lower driver 132. The "upper" and "lower" designations are merely based on respective locations in the drawings, and do not necessarily imply a location with respect to gravity of the physical devices. The upper driver 130 is designed and constructed to selectively: float the upper base 114; short the upper base 114 to the upper terminal 140; and inject charge carriers into the upper base 114 to lower the $V_{CEON}$ of the DSDB BJT 100 during periods of conduction from the upper terminal 140 to the lower terminal 142. Similarly, the lower driver 132 is designed and constructed to selectively: float the lower base 122; short the lower base 122 to the lower terminal 142; and inject charge carriers into the lower base 122 to lower the $V_{CEON}$ of the DSDB BJT 100 during periods of conduction from the lower terminal 142 to the upper terminal 140.

In the example of FIG. 1 the DSDB BJT 100 is arranged for cascode operation with current flowing in either direction. In particular, the DSDB BJT 100 is associated with a lower electrically-controlled switch (hereafter just lower-main switch 144) coupled between the lower collector-emitter 120 and the lower terminal 142. The lower-main switch 144 is selected and implemented to interrupt the load current from the lower collector-emitter 120 to the lower terminal 142 when the externally applied voltage is more positive on the upper terminal 140. Relatedly, the DSDB BJT 100 is associated with an upper electrically-controlled switch (hereafter just upper-main switch 146) coupled between the upper terminal 140 and the upper collector-emitter 112. The upper-main switch 146 is selected and implemented to interrupt the load current from the upper collector-emitter 112 to the upper terminal 140 when the externally applied voltage is more positive on the lower terminal 142.

FIG. 2 shows a partial block diagram, partial electrical schematic, of a power module using a DSDB BJT 200 of PNP construction. In particular, visible in FIG. 2 is a DSDB BJT 200. The DSDB BJT 200 defines the upper collector-emitter 112, the upper base 114, the lower collector-emitter 120, and the lower base 122. A PNP construction is a normally on or normally conductive device. The upper driver 130 and lower driver 132 are designed and constructed to arrange the DSDB BJT 200 for non-conduction during periods when the power module is blocking current. Again as before, even in the case of the power module implementing DSDB BJT 200 of PNP construction, the device may also be arranged for cascode operation in which current interruption is implemented by the lower-main switch 144 or upper-main switch 146 depending on the direction of current flow. As described in co-pending and commonly assigned U.S. App. 63/382,924 filed Nov. 9, 2022 and titled "Methods and Systems of Operating a PNP Bi-Directional Double-Base Bipolar Junction Transistor," in order the lower the $V_{CEON}$ across the device, charge carriers may be injected into an upper P-type region as main load current flows into an upper N-type region, through the bulk N-type region, and then through a lower N-type region. Oppositely, charge carriers may be injected into an lower P-type region as main load current flows into the lower N-type region, through the bulk N-type region, and then through the upper N-type region.

This specification continues under the assumption that the DSDB BJT is of PNP construction with the main load current flowing through the N-type regions, and that the control current flows into the P-type regions, with the understanding that a PNP device is also operable in the opposite configuration (i.e., main load current flowing through the P-type regions). Moreover, the injection techniques may be equally applicable for double-sided devices of NPN construction, and the drawings that follow use transistor symbols with outward pointing arrows as a generic placeholder for double-sided transistors of either construction or arranged use.

Figure 3G:
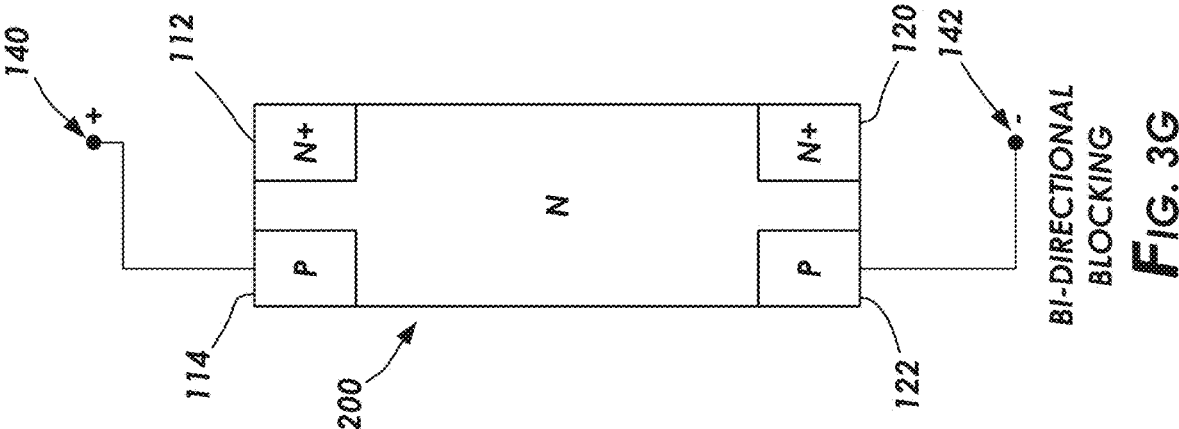

FIGS. 3A-3G show, in shorthand form, a cross-sectional view of a DSDB BJT 200 of PNP construction, with example external electrical connections to illustrate several operational states of the PNP device. In particular, FIGS. 3A-3G show seven example states of the DSDB BJT 200 arranged for the main load current to be carried across or through the N-type regions, the seven states being: passive off (FIG. 3A); active off (FIG. 3B); diode on (FIG. 3C); passive on (FIG. 3D); active on (FIG. 3E); pre-turn off (FIG. 3F); and bi-directional blocking (FIG. 3G). Each will be addressed in turn.

Referring initially to FIG. 3A, FIG. 3A shows the example upper terminal 140 and lower terminal 142. Between the upper terminal 140 and the lower terminal 142 resides the DSDB BJT 200 of PNP construction defining the upper collector-emitter 112, the upper base 114, the lower collector-emitter 120, and the lower base 122. In the examples of FIGS. 3A-3G, the externally applied voltage is assumed to have the more positive polarity associated with the upper terminal 140 relative to the lower terminal 142. In the example passive-off arrangement of FIG. 3A, the upper base 114 is electrically floated, the upper collector-emitter 112 is coupled to the upper terminal 140, the lower base 122 is coupled to the lower terminal 142, and the lower collector-emitter 120 is electrically floated. In the arrangement of FIG. 3A, the DSDB BJT 200 may have a breakdown voltage of 600 Volts or greater, and in some cases about 1200 Volts. Thus, no appreciable current flows through the example DSDB BJT 200 because of the reversed biased PN junction formed between the lower base 122 and the upper collector-emitter 112. The example state of FIG. 3A is referred as "passive off" because the electrical arrangement of FIG. 3A can be implemented with purely passive components (e.g., diodes and resistors), and thus a driver circuit need not have operational power to implement the arrangement of FIG. 3A.

FIG. 3B shows an optional active-off arrangement of the example DSDB BJT 200. In particular, the upper base 114 is electrically floated, the upper collector-emitter 112 is coupled to the upper terminal 140, the lower base 122 is coupled to the lower terminal 142 by way of a voltage source 300, and the lower collector-emitter 120 is electrically floated. The voltage source 300 provides a negative bias to the lower base 122 relative to the lower collector-emitter 120. In the arrangement of FIG. 3B, the DSDB BJT 200 may have a breakdown voltage of 600 Volts or greater, and in some cases about 1200 Volts. Thus again, in the active-off arrangement, no appreciable current flows through the DSDB BJT 200 because of the reversed biased PN junction formed between the lower base 122 and the upper collector-emitter 112. The example state of FIG. 3B is referred as "active off" because in the electrical arrangement of FIG. 3B the associated driver circuit uses operational power to implement the arrangement (e.g., to power the power source 300).

FIG. 3C shows a diode-on arrangement of the example DSDB BJT 200. In particular, the upper base 114 is coupled to the upper terminal 140, the upper collector-emitter 112 is electrically floated, the lower base 122 is electrically floated, and the lower collector-emitter 120 is coupled to the lower terminal 142. In the diode-on arrangement, the PN junction formed by the upper base 114 and the lower collector-emitter 120 is forward biased, and thus current flows from the upper base 114 to the lower collector-emitter 120. The voltage drop across the example DSDB BJT 200 in the arrangement of FIG. 3C is a diode forward voltage drop of about 0.7 Volts. The diode-on arrangement of FIG. 3C is presented as the opposite of the passive-off arrangement of FIG. 3A, but in practice the diode-on arrangement may only be used in limited circumstances.

FIG. 3D shows a passive-on arrangement of the example DSDB BJT 200. In particular, the upper base 114 is electrically floated, the upper collector-emitter 112 is coupled to the upper terminal 140, the lower base 122 is electrically floated, and the lower collector-emitter 120 is coupled to the lower terminal 142. The voltage drop across the DSDB BJT 200 in the arrangement of FIG. 3D is based on the substrate resistance (e.g., for a 260 μm thick substrate, about 2 ohms). The example state of FIG. 3D is referred as "passive on" because the conductive state does not involve injection of charge carriers in an attempt to lower the forward voltage drop $V_{CEON}$, as shown in the active-on arrangement of FIG. 3E.

Figure 3F:
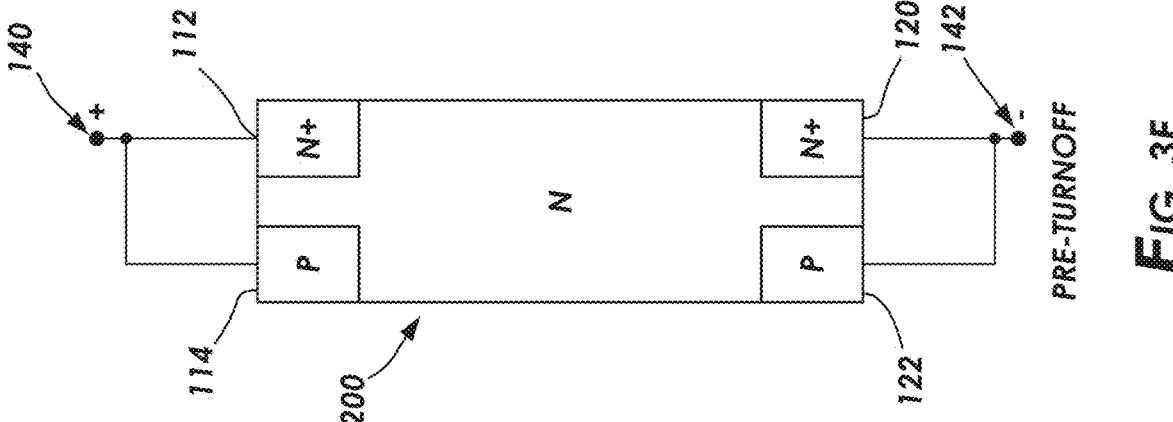
Figure 3E:
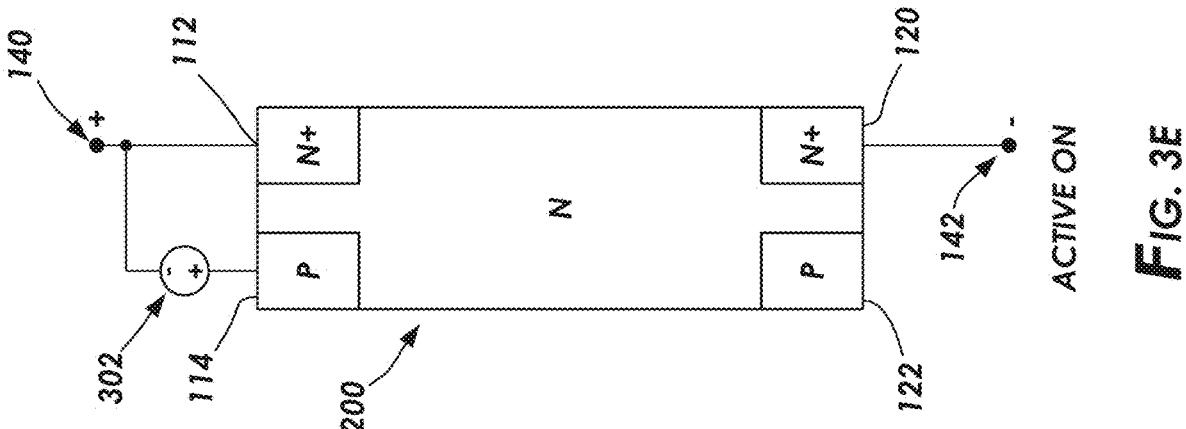

FIG. 3E shows an active-on arrangement of the example DSDB BJT 200. In particular, the upper base 114 is coupled to the upper terminal 140 by way of a voltage source 302, the upper collector-emitter 112 is coupled to the upper terminal 142, the lower base 122 is electrically floated, and the lower collector-emitter 120 is coupled to the lower terminal 142. The voltage source 302 provides a positive bias to the upper base 114 relative to the upper collector-emitter 112, and the voltage source 302 may provide any suitable bias voltage (e.g., 0.2 V-2V). The voltage source 302 injects charge carriers across the PN junction into the bulk substrate, which lowers forward voltage drop $V_{CEON}$, measured from the upper collector-emitter 112 to the lower collector-emitter 120, to about 0.2V for 30 Amps (A) of main current flow, compared to about 10-20V in the absence of charge carrier injection.

FIG. 3F shows a pre-turn-off arrangement of the example DSDB BJT 200. In particular, the upper base 114 is coupled to the upper terminal 140, the upper collector-emitter 112 is coupled to the upper terminal 140, the lower base 122 is coupled to the lower terminal 142, and the lower collector-emitter 120 is coupled to the lower terminal 142. An equivalent arrangement may be to omit the coupling of the upper base 114 to the upper terminal 140. In the pre-turn-off arrangement of FIG. 3F, the example DSDB BJT 200 presents about 2 ohm resistance across the terminals 140 and 142. Thus, for the example 30 A main load current, in the pre-turn-off arrangement of FIG. 3F presents about a 60V drop from the upper terminal 140 to the lower terminal 142.

FIG. 3G shows a bi-directional-blocking arrangement of the example DSDB BJT 200. In particular, the upper base 114 is coupled to the upper terminal 140, the upper collector-emitter 112 is electrically floated, the lower base 122 is coupled to the lower terminal 142, and the lower collector-emitter 120 is electrically floated. Thus, no appreciable current flows through the DSDB BJT 200. In the arrangement of FIG. 3G, the example DSDB BJT 200 may have a breakdown voltage of 600 Volts or greater, and in some cases about 1200 Volts, in either applied polarity.

In many circumstances, the example DSDB BJT 200 will be arranged to transition from either the passive-off arrangement of FIG. 3A or active-off arrangement of FIG. 3B directly to the active-on arrangement of FIG. 3E without implementing an intermediate arrangement or state. Nevertheless, the diode-on arrangement of FIG. 3C and the passive-on arrangement of FIG. 3D may find use in some circumstances. With the respect to transitions from conductive to non-conductive, in many circumstances the example DSDB BJT 200 will be transitioned from the active-on arrangement of FIG. 3E directly to the active-off arrangement of FIG. 3B, the passive-off arrangement of FIG. 3A, or the bi-directional-blocking arrangement of FIG. 3G without implementing an intermediate arrangement or state. Nevertheless, the diode-on arrangement of FIG. 3C, the passive-on arrangement of FIG. 3D, and the pre-turn-off arrangement of FIG. 3F may find use in some circumstances.

The examples of FIGS. 3A-3G are for the situation of the externally applied voltage having a positive polarity at the upper terminal 140. However, the example PNP DSDB BJT 200 is a symmetrical device, and now understanding how to control current flow through the DSDB BJT with example polarity shown, control of current flow in the opposite direction directly follows. Moreover, now understanding various operational states of the PNP configuration with main load current flowing through the N-type regions, one of ordinary skill could derive equivalent arrangements for PNP arrangement with main load current flowing through the P-type regions, and for NPN arrangements.

Figure 4:
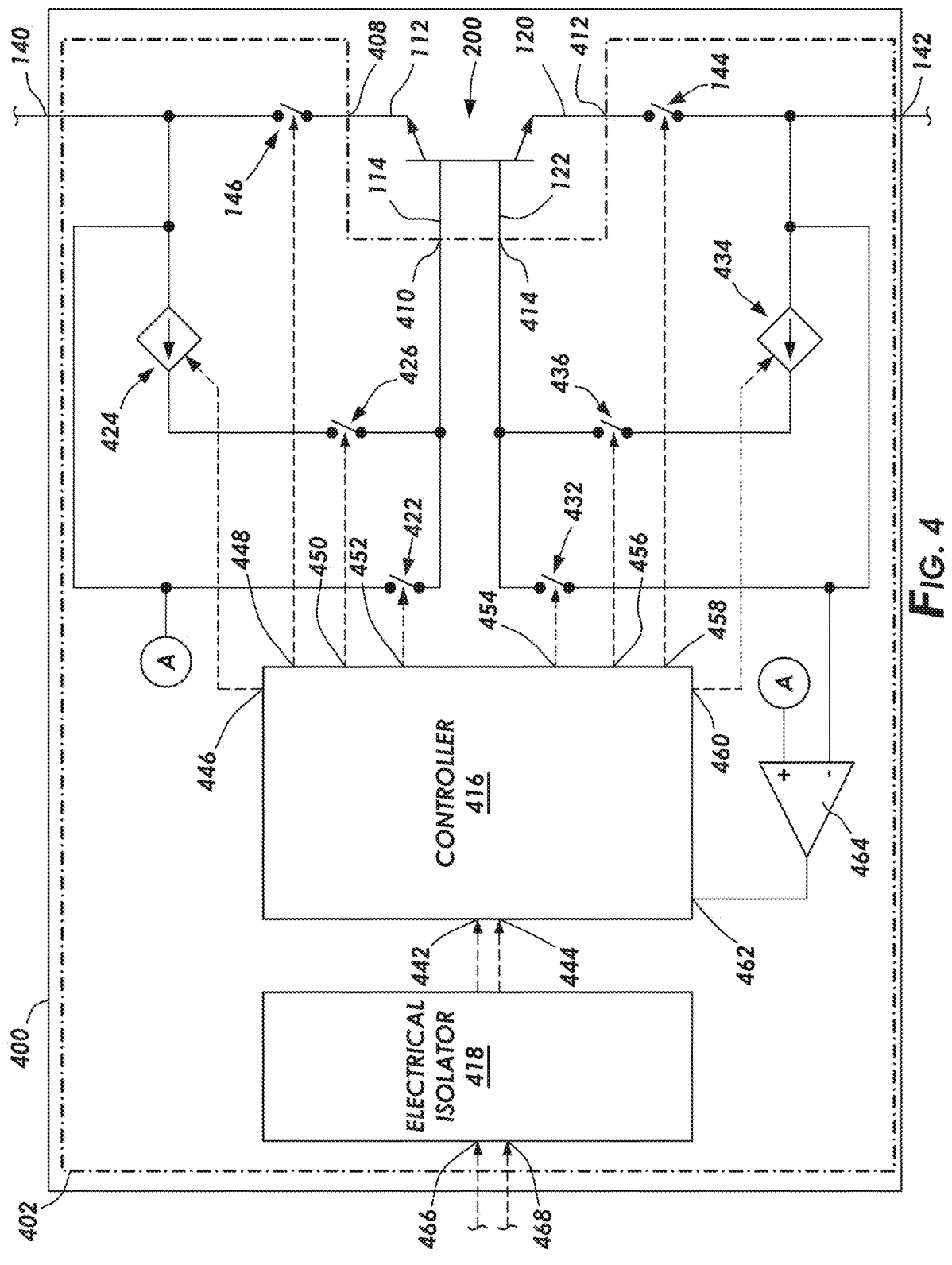
FIG. 4 shows a partial block diagram, partial electrical schematic, of a switch assembly in accordance with at least some embodiments.

FIG. 4 shows a partial block diagram, partial electrical schematic, of an example power module or switch assembly. In particular, the switch assembly 400 comprises the example DSDB BJT 200 of PNP construction and a driver 402. The example driver 402 defines an upper collector-emitter terminal 408 coupled to the upper collector-emitter 112, an upper-conduction terminal 410 coupled to the upper base 114, a lower collector-emitter terminal 412 coupled to the lower collector-emitter 120, and a lower-conduction terminal 414 coupled to the lower base 122. The upper collector-emitter 112 may be coupled to the upper terminal 140 of the switch assembly 400 by way of the upper collector-emitter terminal 408. The lower collector-emitter

120 may be coupled to the lower terminal 142 of the switch assembly 400 by way of the lower collector-emitter terminal 412.

The example driver 402 further comprises a controller 416 and an electrical isolator 418. In order to place the DSDB BJT 200 in the various conduction and non-conduction modes, the example driver 402 includes a plurality of electrically-controlled switches and sources of charge carriers. In particular, the example driver 402 comprises a switch 422 that has a first lead coupled to the upper terminal 140, a second lead coupled to the upper base 114, and a control input coupled to the controller 416. The example switch 422 is shown as a single-pole, single-throw switch, but in practice the switch 422 may be a FET with the control input being a gate of the FET. Thus, when the switch 422 is made conductive by assertion of its control input, the upper base 114 is coupled to the upper terminal 140.

The driver 402 further comprises a source of charge carriers illustratively shown as a controlled current source 424 (hereafter just upper current source 424). The upper current source 424 has sink input coupled to the upper terminal 140. Another electrically-controlled switch 426 (hereafter just switch 426) has a first lead coupled to the source output the upper current source 424, a second lead coupled to the upper base 114, and a control input coupled to the controller 416. The example switch 426 is also shown as a single-pole, single-throw switch, but in practice the switch 426 may be a FET with the control input being the gate of the FET. Thus, when the switch 426 is conductive, the upper current source 424 is coupled between the upper terminal 140 and the upper base 114.

The driver 402 further comprises the upper-main switch 146 that has a first lead coupled to the upper terminal 140, a second lead defining the upper collector-emitter terminal 408 coupled to the upper collector-emitter 112, and a control input coupled to the controller 416. As before, the example upper-main switch 146 is shown as a single-pole, single-throw switch, but in practice the upper-main switch 146 may be a FET with the control input being a gate of the FET. Thus, when the upper-main switch 146 is made conductive, such as by assertion of its control input, the upper terminal 140 is coupled to the upper collector-emitter 112.

Turning now to lower side of the DSDB BJT 200, the example driver 402 further comprises a switch 432 that has a first lead coupled to the lower terminal 142, a second lead coupled to the lower base 122, and a control input coupled to the controller 416. The example switch 432 is shown as a single-pole, single-throw switch, but in practice the switch 432 may be a FET with the control input being a gate of the FET. Thus, when the switch 432 is made conductive by assertion of its control input, the lower base 122 is coupled to the lower terminal 142.

The driver 402 further comprises a source of charge carriers illustratively shown as a controlled current source 434 (hereafter just lower current source 434). The lower current source 434 has a sink input coupled to the lower terminal 142. Another electrically-controlled switch 436 (hereafter just switch 436) has a first lead coupled to the source output of the lower current source 434, a second lead coupled to the lower base 122, and a control input coupled to the controller 416. The example switch 436 is shown as a single-pole, single-throw switch, but in practice the switch 436 may be a FET with the control input being the gate of the FET. Thus, when the switch 436 is conductive, the lower current source 434 is coupled between the lower terminal 142 and the lower base 122.

The example driver 402 further comprises the lower-main switch 144 that has a first lead coupled to the lower terminal 142, a second lead defining the lower collector-emitter terminal 412 coupled to the lower collector-emitter 120, and a control input coupled to the controller 416. As before, the example lower-main switch 144 is shown as a single-pole, single-throw switch, but in practice the lower-main switch 144 may be a FET with the control input being a gate of the FET. Thus, when the lower-main switch 144 is conductive, such as by assertion of its control input, the lower terminal 142 is coupled to the lower collector-emitter 120.

The controller 416 defines control inputs 442 and 444, and control outputs 446, 448, 450, 452, 454, 456, 458, and 460. When implemented, control output 446 is coupled to the control input of the upper current source 424. Control outputs 448, 450, 452, 454, 456, and 458 are coupled to the control inputs of switches 146, 426, 422, 432, 436, and 144, respectively. When implemented, control output 460 is coupled to the control input of the lower current source 434.

When the control input 442 is asserted, the controller 416 is designed and constructed to arrange the DSDB BJT 200 for conduction from the upper terminal 140 to the lower terminal 142. Oppositely, when the control input 442 is de-asserted, the controller 416 is designed and constructed to arrange the DSDB BJT 200 to block current flow from the upper terminal 140 to the lower terminal 142. Similarly, when the control input 444 is asserted, the controller 416 is designed and constructed to arrange the DSDB BJT 200 for conduction from the lower terminal 142 to the upper terminal 140. When the control input 444 is de-asserted, the controller 416 is designed and constructed to arrange the DSDB BJT 200 to block current flow from the lower terminal 142 to the upper terminal 140. When the control inputs 442 and 444 are both asserted, the controller 416 arranges the DSDB BJT 200 for current flow in both directions (e.g., AC breaker service), and when the control inputs 442 and 444 are both de-asserted, the controller 416 blocks current flow in both directions.

The passive-off arrangement and the active-off arrangement of the example DSDB BJT 200 are dependent upon the polarity of the applied voltage. Thus, the example controller 416 may further define a polarity input 462 that receives a Boolean signal indicative of the applied polarity. In the example driver 402, a comparator 464 has a first input coupled to the upper terminal 140 (the connection shown by bubble "A") and a second input coupled to the lower terminal 142. The comparator 464 defines a compare output coupled to the polarity input 462. While FIG. 4 shows the first and second inputs coupled directly to the respective conduction terminals, in practice the voltage across the DSDB BJT 200 when non-conductive may be large (e.g., 1200V) and thus each of the first and second inputs may be coupled to their respective conduction terminals by way of respective voltage divider circuits. In yet still further cases, the applied polarity may be determined by systems and devices external to the switch assembly 400, and a Boolean signal sent across the electrical isolator 418 to the control input 462.

Transitioning the example DSDB BJT 200 from non-conductive, to conductive, and then back to non-conductive may be a multistep process. To implement the multistep process, the controller 416 may be individual circuit components, an application specific integrated circuit (ASIC), a microcontroller with controlling software, a reduced-in-struction-set computing (RISC), a digital signal processor (DSP), a processor with controlling software, a program-mable logic device (PLD), a field programmable gate array (FPGA), a programmable system-on-a-chip (PSOC), and/or combinations, configured to read the control inputs 442 and 444, read the polarity input 462, and drive control outputs to implement the mode transitions of the DSDB BJT 200.

In example systems, the switch assembly 400 is electrically floated. In order to receive the control inputs 442 and 444 in the electrical domain of the switch assembly 400, the example driver 402 implements the electrical isolator 418. The example electrical isolator 418 may take any suitable form, such as optocouplers or capacitive isolation devices. Regardless of the precise nature of the electrical isolator 418, external control signals (e.g., Boolean signals) may be coupled to control inputs 466 and 468 of the electrical isolator 418. The electrical isolator 418, in turn, passes the control signals through to the electrical domain of the switch assembly 400. In the example, the external control signals are passed through to the control inputs 442 and 444 of the controller 416.

Consider, as an example, a situation in which the applied voltage has the positive polarity on the upper terminal 140. Further consider that the control input 466 applied to the electrical isolator 418 is de-asserted, and thus a control signal applied to the control input 442 of the controller 416 is de-asserted. Based on the de-asserted state of the control input 442, the controller 416 is designed and constructed to place the example DSDB BJT 200 in the non-conductive arrangement taking into account the applied polarity (e.g., as read by the controller 416 through the polarity input 462). Thus, in the example arrangement the upper-main switch 146 is conductive, the lower-main switch 144 is non-conductive, and the switch 432 is conductive (passive off). In some examples, the upper-main switch 146 is made conductive by the controller 416 asserting the control output 448. However, in other cases the upper-main switch 146 is implemented as a FET with an internal body diode. Thus, the conductivity of upper-main switch 146 may be based, initially at least, on the applied voltage forward biasing the body diode of the FET implementing the upper-main switch 146. A similar arrangement and/or operation may exist for the lower-main switch 144 when arranged for blocking current for the opposite polarity.

Still considering the example arrangement of the positive polarity at the upper terminal 140, now consider that the control signal applied to the control input 466 of the electrical isolator 418 is asserted, and thus the control signal applied to the control input 442 of the controller 416 is asserted. Based on the assertion, in the example switch assembly 400 the controller 416 may be designed and constructed to place the example DSDB BJT 200 directly into the active-on arrangement (FIG. 3E). To that end, the controller 416 may assert the control output 448 (if not already asserted) to make the upper-main switch 146 conductive, assert the control output 450 to make the switch 426 conductive, assert the control output 458 to make the lower-main switch 144 conductive, and de-assert or leave de-asserted the remaining control outputs. In some cases, the controller 416 may modulate a signal driven to the control output 446 coupled to the upper current source 424 to provide a turn-on current followed by a steady-state current, as discussed in greater detail below; however, in other cases the upper current source 424 may provide the turn-on current followed by the steady-state current each time the switch 426 is made conductive without specific direction from the controller 416.

Optionally, again with the positive polarity at the upper terminal 140, the controller 416 may be designed and constructed to take the example DSDB BJT 200 through an intermediate conductive arrangement before arriving at the active-on arrangement. For example, the controller 416 may momentarily place the DSDB BJT 200 in the passive-on arrangement (FIG. 3D) by asserting the control output 448 to make the upper-main switch 146 conductive, asserting the control output 458 to make the lower-main switch 144 conductive, and de-asserting or leaving de-asserted the remaining control outputs. When used, the passive-on arrangement may last a predetermined period (e.g., from about 0.1 µs to 5 µs). As another example of an intermediate conductive state, the controller 416 may momentarily place the DSDB BJT 200 in the diode-on arrangement (FIG. 3C) by asserting the control output 452 to make the switch 422 conductive, asserting the control output 458 to make the lower-main switch 144 conductive, and de-asserting or leaving de-asserted the remaining control outputs. When used, the diode-on arrangement may last a predetermined period (e.g., from about 0.1 µs to 5 µs). In practice, the upper-main switch 146 may have an internal body diode, or be associated with discrete parallel diode, such that the diode-on arrangement cannot be implemented, as the body diode or discrete parallel diode would be forward biased when the positive polarity is at the upper terminal 140. A similar inability to implement the diode-on arrangement may exist when the positive polarity is at the lower terminal 142 if the lower-main switch 144 has a body diode or a discrete parallel diode. Nevertheless, after the intermediate conductive arrangement, the controller 416 places the DSDB BJT 200 in the active-on arrangement.

In the active-on arrangement, and for the positive polarity at the upper terminal 140, the upper current source 424 injects charge carriers into the upper base 114. Injecting charge carriers into the upper base 114 increases the number of charge carriers in the drift region of the example DSDB BJT 200 of PNP construction, which lowers the $V_{CEON}$ across the upper collector-emitter 112 to the lower collector emitter 120. In one example, the upper current source 424 injecting charge carriers may lower the $V_{CEON}$ across the collector-emitters 112 and 120 to about 0.2V for about 30 A to 100 A of current flow. In some examples, the upper current source 424 is designed and constructed to provide a turn-on current (e.g., between 5 A and 10 A of current), and then provide a steady-state current (e.g., about 5 A of current). Using a current source, rather than a voltage source, accounts for manufacturing variations as between DSDB BJTs. For example, one DSDB BJT may need about 2V of bias from the emitter-collector to the base to achieve 5 A of base current, while a second DSDB BJT, or even the opposite side of the same DSDB BJT, may only need 1.6V of bias to achieve the 5 A of base current.

Still referring to FIG. 4, and still considering the positive polarity on the upper terminal 140. Further consider that the control input 466 applied to the electrical isolator 418 transitions from asserted to de-asserted, and thus a control signal applied to the control input 442 of the controller 416 transitions from asserted to de-asserted. Based on the transition, the controller 416 is designed and constructed to once again place the DSDB BJT 200 in the non-conductive arrangement. In example cases, the controller 416 may, from the conductive state of the DSDB BJT 200, directly implement the passive-off arrangement as previously discussed. Optionally, the controller 416 may be designed and constructed to take the DSDB BJT 200 through an intermediate conductive arrangement before arriving at the non-conductive arrangement. For example, the controller 416 may momentarily place the DSDB BJT 200 in the diode-on arrangement (FIG. 3C), the passive-on arrangement (FIG.

3D), or the pre-turn-off arrangement (FIG. 3F). When used, the intermediate arrangements between active on and active off may last a predetermined period (e.g., from about 0.1 µs to 5 µs).

The example operation discussed with respect to FIG. 4 was with the positive polarity on the upper terminal 140. Again, however, the example DSDB BJT 200 and the related driver are symmetrical, and now understanding how to arrange the DSDB BJT 200 into the various conductive and non-conductive states, control of current flow in the opposite direction directly follows.

The switch assembly of FIG. 4 shows the example DSDB BJT 200 arranged for cascode operation. In such an arrangement, the interruption of current flow through the device (e.g., in the transition from conductive to non-conductive) is implemented primarily by the upper-main switch 146 and the lower-main switch 144. For example, with the positive polarity on the upper terminal 140, current flow through the switch assembly 400 is initially interrupted by the lower-main switch 144, and then the further blocking is implemented by the DSDB BJT 200. Oppositely, with the positive polarity on the lower terminal 142, current flow through the switch assembly 400 is initially interrupted by the upper-main switch 146, and then the further blocking is implemented by the DSDB BJT 200. It follows that since the blocking is implemented by the DSDB BJT 200, the breakdown voltages of the upper-main switch 146 and the lower-main switch 144 may be significantly lower than the breakdown voltage of the DSDB BJT 200. For example, each of the upper-main switch 146 and lower-main switch 144 may have breakdown voltages of 100V or less, in some cases 80V or less, while the breakdown voltage of the DSDB BJT 200 may be 600V or greater, and in some cases about 1200V.

In the transition from a conductive state through the collector-emitters 112 and 120 to a non-conductive state, a relatively small amount of current—a shutoff current—may flow momentarily through base on the side opposite the positive polarity. For example, with the positive polarity on the upper terminal 140 and current flow from the upper collector-emitter 112 to the lower collector-emitter 120, interrupting the current flow by the lower-main switch 144 may cause a shutoff current to flow momentarily through the lower base 122. Stated differently, when the load current through the DSDB BJT 200 is interrupted by the lower-main switch 144, the shutoff current is commutated through the lower base 122 for a short period of time as the lower PN junction becomes reversed biased (keeping in mind that, for the assumptions, the lower base 122 is electrically floated during conduction). Thus, the passive-off arrangement (FIG. 3A) provides a current path for the shutoff current to the lower terminal 142. Now understanding the commutation of the current through the lower base 122 when the more positive voltage is at the upper terminal 140, an equivalent discussion of commutation current through the upper base 114 when the more positive voltage is at the lower terminal 142 follows directly.

Figure 5:
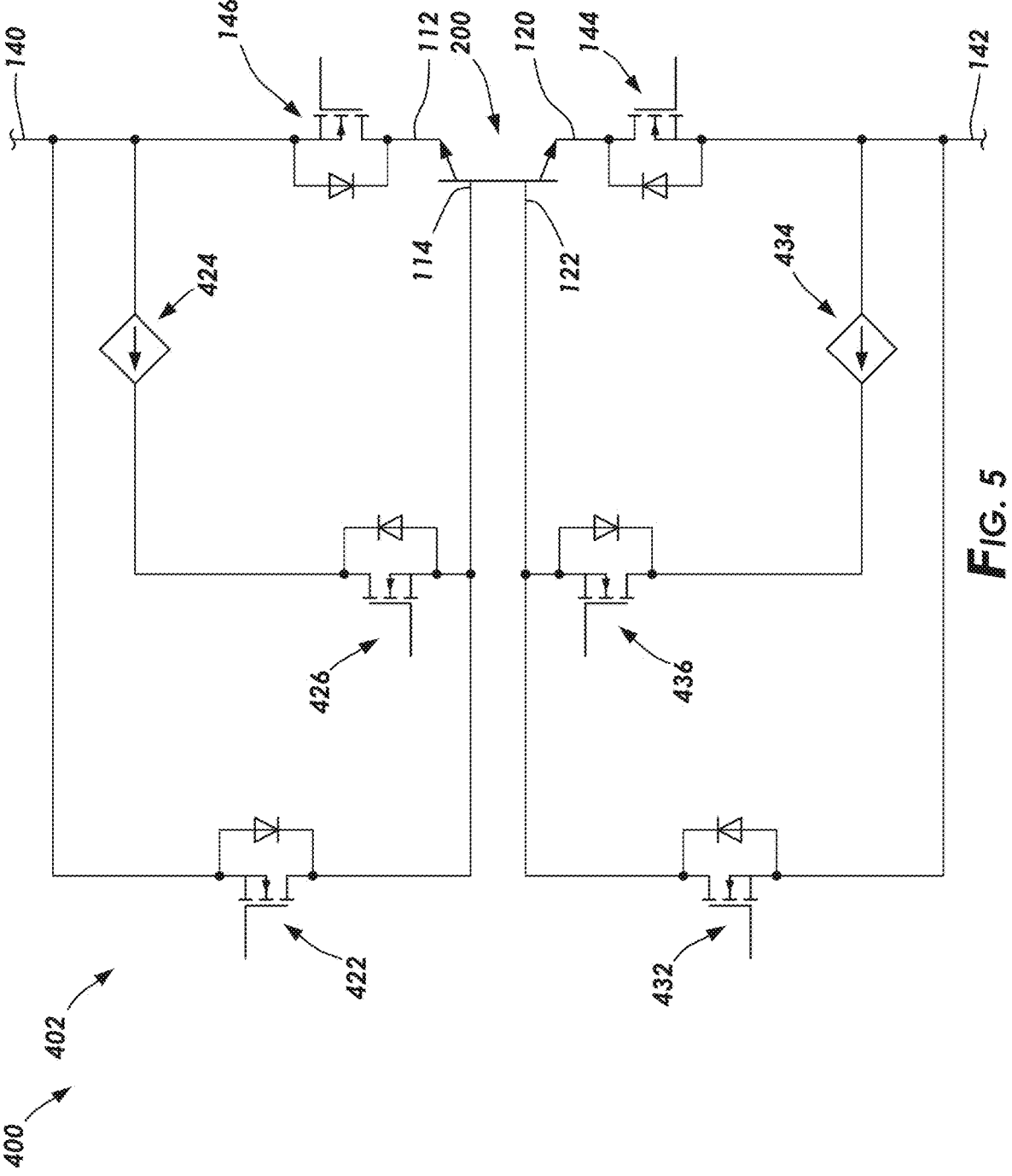
FIG. 5 shows a partial electrical schematic of a switch assembly in accordance with at least some embodiments.

FIG. 5 shows a partial electrical schematic of an example switch assembly 400. In particular, FIG. 5 shows the example DSDB BJT 200 of PNP construction as well as portions of an example driver 402. The driver 402 may likewise have the electrical isolator, the controller, and the comparator, but those components are omitted from the shorthand notation of FIG. 5. For purposes of discussion, the upper side FIG. 5 shows the switches 422, 426, and 146, as well as the example upper current source 424. The lower side shows the switches 432, 436, and 144, as well as the example lower current source 434.

As alluded to above, many of the switches are implemented as FETs. In the example switch assembly of FIG. 5 the upper-main switch 146 is shown as a FET having a source coupled to the upper terminal 140, a drain coupled to the upper collector-emitter 112, a gate defining the control input, and a body diode coupled between the source and the drain. When the applied voltage has a positive polarity on the upper terminal 140, the body diode is forward biased making the upper-main switch 146 conductive (without action by the controller 416 (FIG. 4)). During conductive states of the DSDB BJT 200 the controller 416 drives the gate to make the FET conductive to lower the overall voltage drop. In example cases, the FET used to implement the upper-main switch 146 may have a breakdown voltage of 100V or less, and in some cases about 80V, in spite of the fact the DSDB BJT 200 may have a breakdown voltage of 600V or more, and in some cases about 1200V.

The example switch 422 is shown as a single FET having a source coupled to the upper terminal 140 and a drain coupled to the upper base 114, and a gate. The gate of the FET is coupled to the controller 416 (FIG. 4). The FET has a body diode having an anode coupled to the upper terminal 140 and a cathode coupled to the upper base 114. With the positive polarity on the upper terminal 140, the switch 422 may be conductive during the diode-on arrangement (FIG. 3C) or the pre-turn-off arrangement (FIG. 3F). During the active-on arrangement (FIG. 3E), however, the switch 422 is non-conductive to enable the upper current source 424 to inject charge carriers into the upper base 114. That is, in the active-on arrangement the controller 416 de-asserts the gate of FET, and because the upper base 114 is positively biased based on the upper current source 424, the body diode is reversed biased—no current flows through the switch 422. In situations in which the positive polarity is on the lower terminal 142, the switch 422 may be made conductive in transitions to the passive-off arrangement. For example, the shutoff current in the passive-off arrangement may be carried by switch 422.

Similarly, switch 426 is shown as a single FET. In particular, the switch 426 is shown as a single FET having a source coupled to the upper base 114, a drain coupled to the source output of the upper current source 424, and a gate. The gate of the FET is coupled to the controller 416 (FIG. 4). The FET has a body diode, and in the arrangement shown the anode is coupled to the upper base 114 and the cathode is coupled to the source output of the upper current source 424. With positive polarity on the upper terminal 140, the active-on arrangement may be implemented with the upper current source 424 injecting charge carriers into the upper base 114 through the FET. In other modes, with the switch 426 non-conductive, the current flow from the upper current source 424 to the upper base 114 is blocked.

Still referring to FIG. 5, the lower-main switch 144 is shown as a FET having a source coupled to the lower terminal 142, a drain coupled to the lower collector-emitter 120, a gate defining the control input, and a body diode coupled between the source and the drain. When the applied voltage has a positive polarity on the lower terminal 142, the body diode is forward biased making the lower-main switch 144 conductive (without action by the controller 416 (FIG. 4)). During conductive states of the DSDB BJT 200, the controller 416 drives the gate to make the FET conductive to lower the overall voltage drop. In example cases, the FET used to implement the lower-main switch 144 may have a breakdown voltage of 100V or less, and in some cases about 80V, in spite of the fact the DSDB BJT 200 may have a breakdown voltage of 600V or more, and in some cases about 1200V.

The example switch 432 is shown as a single FET having a source coupled to the lower terminal 142 and a drain coupled to the lower base 122, and a gate. The gate of the FET is coupled to the controller 416 (FIG. 4). The FET has a body diode having an anode coupled to the lower terminal 142 and a cathode coupled to the lower base 122. With the positive polarity on the lower terminal 142, the switch 432 may be conductive during the diode-on arrangement (FIG. 3C) or the pre-turn-off arrangement (FIG. 3F). During the active-on arrangement (FIG. 3E), however, the switch 432 is non-conductive to enable the lower current source 434 to inject charge carriers into the upper base 114. That is, in the active-on arrangement the controller 416 de-asserted the gate of FET, and because the lower base 122 is positively biased based on the lower current source 434, the body diode is reversed biased—no current flows through the switch 432. In situations in which the positive polarity is on the upper terminal 140, the switch 432 may be made conductive in transitions to the passive-off arrangement. For example, the shutoff current in the passive-off arrangement may be carried by switch 432.

Similarly, switch 426 is shown as a single FET. In particular, the switch 426 is shown as a single FET having a source coupled to the lower base 122, a drain coupled to the source output of the lower current source 434, and a gate. The gate of the FET is coupled to the controller 416 (FIG. 4). The FET has a body diode, and in the arrangement shown the anode is coupled to the lower base 122 and the cathode is coupled to the source output of the lower current source 434. With positive polarity on the lower terminal 142, the active-on arrangement may be implemented with the lower current source 434 injecting charge carriers into the lower base 122 through the FET. In other modes, with the switch 436 non-conductive, the current flow from the lower current source 434 to the lower base 122 is blocked.

The body diodes of the switches 426 and 436 may be used to enable a power-up safe mode. That is, the body diodes of the switches ensure race conditions at power up of the switch assembly 400 do not cause inadvertent conduction through the DSDB BJT 200. In particular, the switch assembly 400 may have the upper terminal 140 and lower terminal 142 coupled within an overall system. Voltage may appear across the upper terminal 140 and lower terminal 142 in either polarity before the controller 416 is powered up, and/or before the controller 616 has had an opportunity to bootstrap to an operational state. Consider, as an example, a power up condition in which the positive polarity appears at the upper terminal 140 before the controller 416 is operational. In such a situation, the body diode of the FET implementing the upper-main switch 146 is conductive, and body diode of the FET implementing the lower-main switch 144 will be reversed biased. Leakage current through the DSDB BJT 200 causes the body diode of the FET implementing the switch 436 to be conductive. In combination with a high value resistor electrically in parallel to the lower current source 434 (the resistor not specifically shown), the switch assembly 400 effectively implements the passive-off arrangement (FIG. 3A). A similar arrangement occurs when the positive polarity appears on the lower terminal 142. Thus, even in the absence of control by the controller 416, the example DSDB BJT 200 of PNP construction enters a non-conductive safe mode regardless of the polarity of the voltage applied across the upper terminal 140 and lower terminal 142.

In related art implementations, the active-on arrangement (FIG. 3E) is implemented with multiple voltage sources over time. For example, in commonly assigned U.S. Pat. No. 11,522,051, and particularly FIG. 9 of the patent, two separate voltage sources are used for injection of charge carriers on each side of the device—a 5V source (reference number 826 in that patent) is initially used to quickly drive down the $V_{CEON}$, and then a 1V source (reference number 822 in that patent) to maintain the lowered $V_{CEON}$. Having multiple, selectively applied, voltage sources increases the cost and complexity of the switch module.

The inventors of the current specification discovered that by using a current source, rather than multiple voltage sources, the complexity of the switch assembly can be significantly reduced, yet still retaining the benefits of the dual injection of charge carriers. Still referring to FIG. 5, and particularly the upper current source 424. In example situations with the applied polarity being more positive on the upper terminal 140, making the switch assembly 400 conductive may involve arranging the DSDB BJT 200 for conduction (e.g., FIG. 3E) by first driving a turn-on current into the upper base 114 from the upper current source 424, and then providing a steady-state current to the upper base 114 from the upper current source 424. In various examples, the steady-state current provided by the upper current source is lower than the turn-on current. Stated otherwise, turn-on current provided by the upper current source 424 is used to charge the base-emitter capacitance and make the DSDB BJT 200 conductive quickly, and the steady-state current is used to maintain the low $V_{CEON}$. Oppositely, with the applied polarity being more positive on the lower terminal 142, making the switch assembly 400 conductive may involve arranging the DSDB BJT 200 for conduction (e.g., FIG. 3E) by first driving a turn-on current into the lower base 122 from the lower current source 434, and then providing a steady-state current to the lower base 122 from the lower current source 434. Here too, the steady-state current provided from the lower current source is lower than the turn-on current.

That is, the inventors of the current specification discovered that a single current source associated with a base of the DSDB BJT 200 may be used in place of multiple voltage sources, significantly reducing the complexity and number of components used to implement the switch assembly 400. Moreover, use of a current source, rather than voltage sources, accounts for manufacturing variations as between DSDB BJTs. For example, one DSDB BJT may need about 2V of bias from the emitter-collector to the base to achieve an example steady-state base current of 5 A, while a second DSDB BJT, or even the opposite side of the same DSDB BJT, may only need 1.6V of bias to achieve the example steady-state base current of 5 A. The specification now turns to an example implementation of the current sources.

Figure 6:
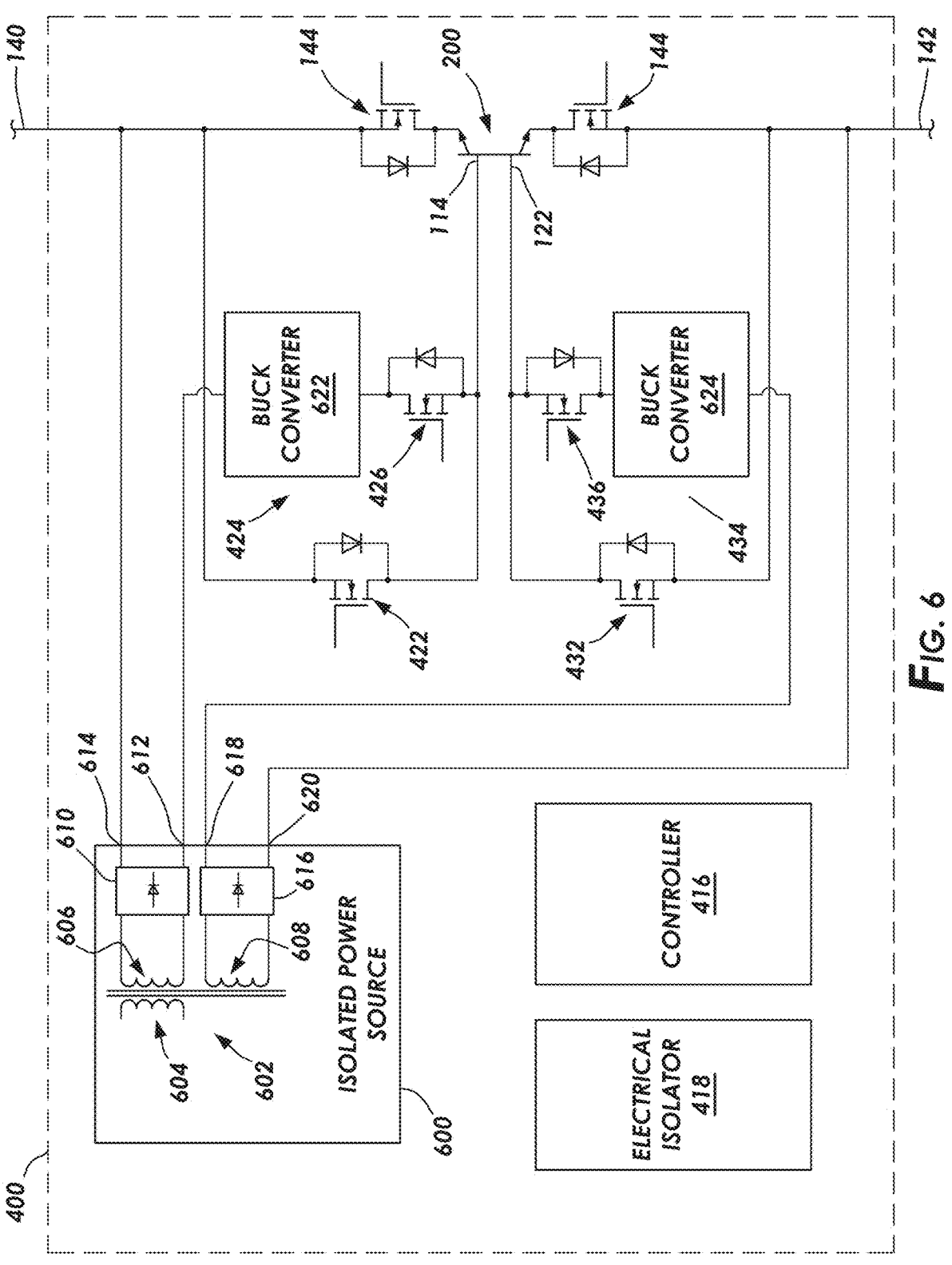
FIG. 6 shows partial schematic, partial block diagram, of an example switch assembly in accordance with at least some embodiments.

FIG. 6 shows partial schematic, partial block diagram, of an example switch assembly 400 in accordance with at least some embodiments. In particular, FIG. 6 shows the upper terminal 140, the upper-main switch 146, the example DBSD BJT 200, the lower-main switch 144, and the lower terminal 142. FIG. 6 also shows the switches 422 and 426 associated with the upper base 114, and the switches 432 and 436 associated with the lower base 122. FIG. 6 also shows the electrical isolator 418 and the controller 416; however, the electrical connections between the electrical isolator 418 and the controller 416 are not shown, and the electrical connections from the controller 416 to the control inputs (e.g., gates) of the various switches are not shown so as not to unduly complicate the figure.

FIG. 6 further shows an isolated power source 600. The term "isolated" in this context may have several meanings. In some cases, the switch assembly 400 is provided operation power from a source of power distinct from the controlled power that is coupled to the upper terminal 140 and the lower terminal 142. In such cases, "isolated" may mean the switch assembly 400 is electrically floated relative to the source of power, and in such cases power is provided through an isolation transformer. The switch assembly 400 may alternatively be "self-powered" in that operational power is derived directly from the controlled power applied to the upper terminal 140 and/or the lower terminal 142, and an example "self-powered" switch assembly is discussed in greater detail below.

"Isolated" in this context may also mean that the isolated power source 600 provides power rails to the upper and lower portions of the circuit, where those power rails carry voltages with respect to different reference voltages or different returns. To that end, the example isolated power source 600 shows a transformer 602 defining a primary winding 604, an upper secondary winding 606, and a lower secondary winding 608. The upper secondary winding 606 is associated with a rectifier 610. The rectifier 610 may take many forms depending on the operation of the isolated power source 600. For example, the rectifier 610 may be half- or full-wave bridge and associated voltage regulator. In other cases, the isolated power source 600 may be an isolated switching power converter, such as a flyback converter, and thus rectifier 610 may work in conjunction with circuits associated with the primary winding 604 to create a controlled DC voltage. Regardless, the upper secondary winding 606 and rectifier 610 define an upper power rail 612 that carries a voltage referenced to the upper return 614 coupled to the upper terminal 140. Stated otherwise, the supply voltage provided to the upper power rail 612 is DC voltage referenced to the voltage on the upper terminal 140. Thus, the voltage carried on the upper power rail 612 may be used to inject charge carriers into the upper base 114.

Still referring to FIG. 6, the lower secondary winding 608 is associated with a rectifier 616. The rectifier 616 likewise may take many forms depending on the operation of the isolated power source 600, such as half- or full-wave bridge and associated voltage regulator, or a secondary rectifier of a flyback converter. Regardless, the lower secondary winding 608 and rectifier 616 define a lower power rail 618 that carries a voltage referenced to the lower return 620 coupled to the lower terminal 142. Stated otherwise, the supply voltage provided to the lower power rail 618 is a DC voltage referenced to the voltage on the lower terminal 142. Thus, the voltage carried on the lower power rail 618 may be used to inject charge carriers into the lower base 122. In some cases, the DC voltages on the upper power rail 612 and the lower power rail 618 have the same magnitude, and may be between 3.3V and 20V, and in some cases about 5V.

The example switch assembly 400 shows the upper current source 424 in the example form a buck converter 622. The example buck converter 622 is designed and constructed to act as a current source, modulating the voltage to supply the turn-on current and then the steady-state current to the upper base 114. Similarly, the example switch assembly 400 shows the lower current source 434 in the example form a buck converter 624. The example buck converter 624 is designed and constructed to act as a current source, modulating the voltage to supply the turn-on current and then the steady-state current to the lower base 122. The buck converters 622 and 624 may take any suitable form. In most cases, the buck converters 622 and 624 are duplicate circuits, but having duplicative buck converters is not strictly required. The specification now turns to an example implementation of the buck converters.

Figure 7:
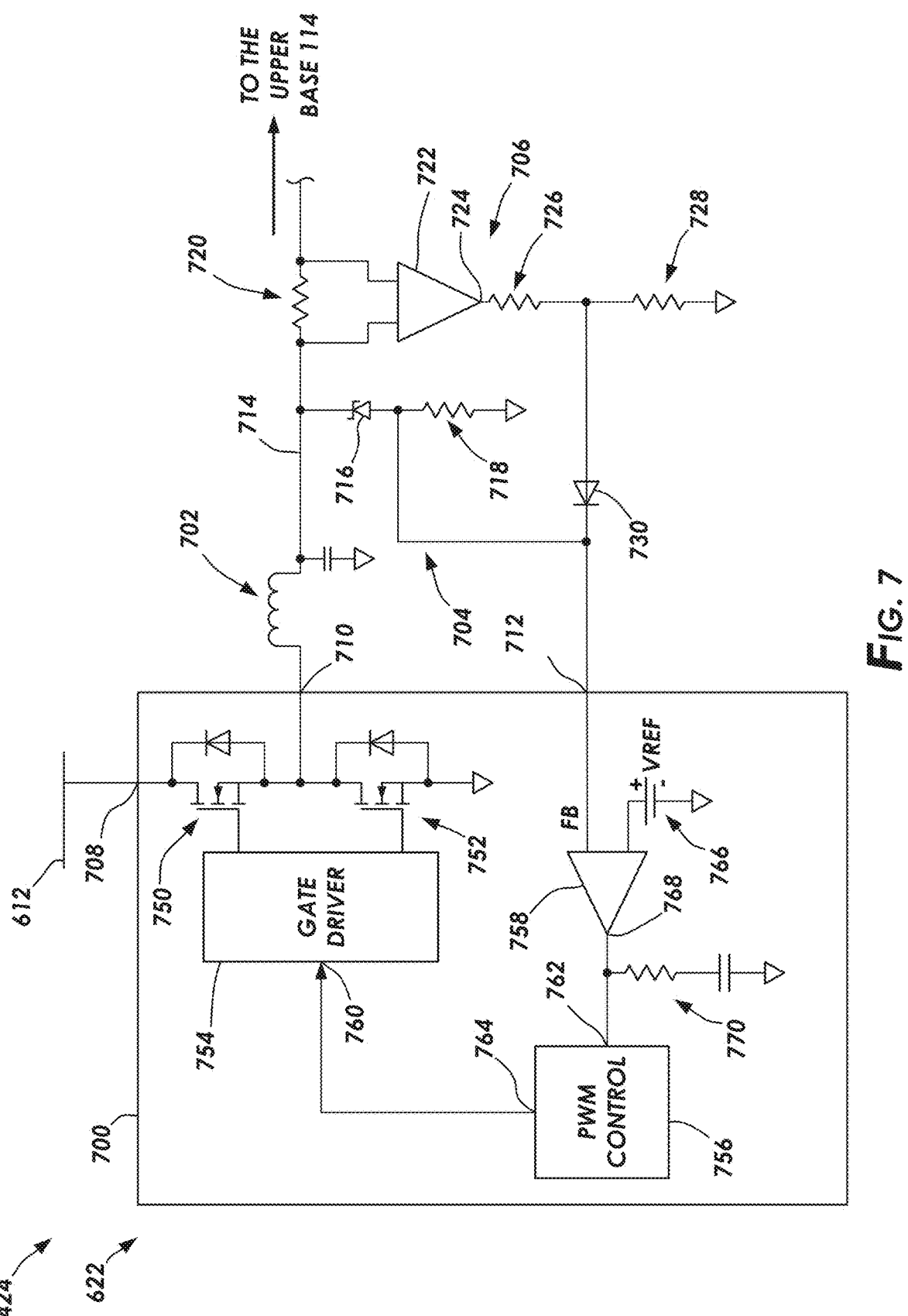
FIG. 7 shows a partial block diagram, partial electrical schematic, of a buck converter in accordance with at least some embodiments.

FIG. 7 shows a partial block diagram, partial electrical schematic, of buck converter 622 in accordance with at least some embodiments. In particular, the example buck converter 622 comprises driver 700, inductor 702, a voltage feedback 704, and a current feedback 706. The driver 700 defines a voltage input 708 coupled to the upper power rail 612, a switch-node terminal 710 coupled to the first lead of the inductor 702, and a feedback terminal 712 coupled to both the voltage feedback 704 and the current feedback 706. Additional terminals will be present, such as a power terminals, ground or return terminals, and terminals through which startup power for the driver 700 is provided. The additional terminals are not shown so as not to unduly complicate the figure.

The driver 700 is designed and constructed to apply a square wave voltage to the switch-node terminal 710 by alternately coupling the upper power rail 612 to the switch-node terminal 710, and then coupling the voltage reference or return to the switch-node terminal 710. During periods of time when the upper power rail 612 is coupled to the switch-node terminal 710, current ramps upward through the inductor 702 and energy is stored in the field surrounding the inductor—charge modes of the inductor. During periods when the return is coupled to the switch-node terminal 710, the field around the inductor 702 collapses as the inductor 702 continues to provide current to downstream devices—discharge mode of the inductor. Based on signals received on the feedback terminal 712, the driver 700 controls the voltage/current provided from the inductor 702 by controlling the frequency and/or duty cycle of the square wave voltage applied to the switch node. Moreover, the voltage reference or return for the buck converter 622 is the voltage on the upper terminal 140 (not shown in FIG. 7) of the switch assembly 400.

In accordance with various examples, the feedback to the driver 700 has a voltage-feedback component provided by the voltage feedback 704, and a current-feedback component provided by the current feedback 706. The example voltage feedback 704 comprises a Zener diode 716 having its cathode coupled to the voltage output 714 defined by a second lead of the inductor 702, and its anode coupled to the feedback terminal, and also coupled to the return by way of resistor 718. Once the voltage output 714 overcomes the breakdown voltage of the Zener diode, a feedback signal is provided to the feedback terminal 712 proportional to the voltage on the voltage output 714. In other cases, the voltage feedback may be provided by a shunt voltage reference or similar analog circuit. Regardless, in example cases, as the output voltage goes up, the magnitude of the feedback signal from the voltage feedback 704 goes up, and vice versa.

The current feedback 706 is designed and constructed to produce a current feedback proportional to current provided from the inductor 702 to the upper base 114 (not shown in FIG. 7). The example current feedback 706 comprises a shunt or series resistor 720 coupled in series with the current flow provided from the inductor 702. The series resistor 720 has a relatively small value (e.g., 2 Ohm-10 Ohm), and the voltage drop across the series resistor 720 is thus proportional to the current provided from the inductor 702. In other cases, the signal indicative of current may be extracted by a current transformer coupled in series with the voltage output 714, or a Hall-effect sensor. The example current feedback 706 further comprises an amplifier 722 defining a first input coupled to a first lead of the series resistor 720, a second input coupled to the second lead of the series resistor 720, and an amplifier output 724. The amplifier 722 may be, for example, an operational amplifier with various feedback paths to control or set the gain; however, the various feedback paths and power connections are omitted so as not to unduly complicate the figure. The amplifier 722 is designed and constructed to produce, on the amplifier output 724, a voltage proportional to the current provided from the inductor 702 to the upper base 114. In the example system, the amplifier output 724 is coupled to voltage divider comprising resistors 726 and 728 referenced to the return of the upper power rail 612. The node between the resistors 726 and 728 is coupled to the anode of a diode 730, and the cathode of the diode 730 is coupled to the feedback terminal 712. In operation, the current feedback 706 produces a feedback signal proportional to current. Once the feedback signal proportional to current rises above the feedback signal produced by the voltage feedback 704 (e.g., forward biases the diode 730), the feedback provided to the driver 700 is controlled or dominated by the current feedback 706.

When the buck converter 622 is disconnected from the upper base 114 by way of the switch 426 (FIG. 4), no current flows through the inductor 702 and thus the driver 700 regulates the output voltage based solely on the feedback signal provided from the voltage feedback 704. For example, the driver 700 and voltage feedback 704 may be designed and constructed to regulate the output voltage to 5V when there is little or no current flow through the inductor 702. However, when the buck converter 622 is coupled to the upper base 114 by way of the switch 426, current is driven to the upper base 114. In particular, when the switch 426 is closed or made conductive, the buck converter 622 initially drives a turn-on current to the upper base 114. In the example system, because no current was provided prior to closing the switch 426, the turn-on current is based on the voltage output related to the feedback signal derived from voltage feedback 704 alone (i.e., the feedback signal from the current feedback 706 is zero or low).

As the current ramps upward, the contribution of the feedback signal from the current feedback 706 likewise ramps, and eventually the feedback signal from the current feedback 706 forward biases the diode 730 and contributes to the feedback signal provided to the feedback terminal 712, driving the output voltage downward. That is, after providing the turn-on current, the buck converter 622 provides a steady-state current based on the feedback signal derived from voltage feedback 704 and the current feedback 706. In the example system, the transfer function of the feedback path may be dominated by an integral component. That is, speaking of proportional, integral, differential (PID) control, the transfer function of the feedback path may be dominated by the integral component, such PI, or integral only. The result is that there is control lag as the feedback signal applied to the feedback terminal 712 ramps upward. Thus, the turn-on current reaches a peak value higher than the steady-state current. Stated oppositely, the steady-state current is lower than the peak magnitude of the turn-on current.

While in the example system, the transfer function of the feedback path enables the turn-on current to be higher than the steady-state current, the relationship may be implemented in any suitable way. For example, and as implied by FIG. 4, the controller 416 may drive a current setpoint signal to the buck converter 622, with the current setpoint signal initially indicating the higher turn-on current, and then the controller 416 may lower the current setpoint signal to indicate the lower steady-state current.

Still referring to FIG. 7, the driver 700 may take many suitable forms, and FIG. 7 shows an example implementation. The example driver 700 comprises an upper FET 750, a lower FET 752, a gate driver 754, a PWM controller 756, and a difference amplifier 758. The upper FET 750, so named because of its location on the drawing, has a drain coupled to the upper power rail 612, a source coupled to the switch-node terminal 710, and a gate coupled to the gate driver 754. The lower FET 752, so named because of its location on the drawing, has a drain coupled to the switch-node terminal 710, a source coupled to the return (e.g., the upper terminal 140), and a gate coupled to the gate driver 754. When the upper FET 750 is conductive and the lower FET 752 is non-conductive, the upper power rail 612 is coupled to the switch-node terminal 710—charge mode of the inductor 702. Oppositely, when the lower FET 752 is conductive and the upper FET 750 is non-conductive, the return is coupled to the inductor 702—discharge mode of the inductor 702. The example FETs 750 and 752 are shown as integral with the driver 700 (e.g., on the same die as the other components, or a co-packaged with the other components); however, in other cases, such as for higher amperage situations, one or both the FETs 750 and 752 may be discrete components external to the driver 700.

The gate driver 754 is coupled to the gates of the FETs 750 and 752. Responsive to the state of the control input 760 of the gate driver 754, the gate driver 754 controls the conductive states of the FETs 750 and 752. In particular, the gate driver may provide voltage and current used to control the conductive state of the FETs. Moreover, the gate driver 754 may impose timing restrictions between conductive states of the FETs to ensure the upper power rail 612 is not inadvertently shorted to the return, referred to as shoot-through.

The PWM controller 756 defines an error input 762 and a drive output 764 coupled to the control input 760. The error input 762 receives a signal indicative of the voltage error as between a setpoint voltage and the feedback signal(s). The PWM controller drives a pulse-width modulated (PWM) signal to the drive output 764, where the duty cycle and/or frequency of the PWM signal controls the voltage on the voltage output 714 of the buck converter 622. The PWM controller 756 may operate the buck converter 622 using any suitable control scheme, such as current-mode control in which the peak current during each change mode controls the transition from charge mode to discharge mode, or voltage-mode control in which the peak current during each charge mode is controlled by a voltage ramp signal crossing the error signal provided to the error input 762.

Still referring to FIG. 7, the example driver 700 includes the difference amplifier 758. The example difference amplifier 758 defines a first input that is coupled to the feedback terminal 712, and a second input coupled to a voltage reference $V_{REF}$ 766, where the $V_{REF}$ 766 is a voltage representative of the setpoint voltage for the buck converter 622. The example difference amplifier 758 defines a difference output 768 coupled to the error input 762, in including low-pass filter 770 illustratively shown as a series resistor and capacitor. In various examples, the gain of the difference amplifier 758, and the response of the low-pass filter 770, may define, in whole or in part, the transfer function of the feedback loop for the buck converter 622. However, the desired transfer function may be implemented in any suitable way.

The discussion of FIG. 7 is based on the upper current source 424 implemented as buck converter 622. However, now understanding operation of the buck converter 622 with respect to the injection of current into the upper base 114, the description of the lower current source 434 implemented as buck converter 624, and used for injection of current into the lower base 122 is duplicative, and will not be repeated again so as not to unduly lengthen the specification. That is, the buck converter 624 operates similarly, except the buck converter 624 draws power from the lower power rail 618 having a voltage referenced to the lower terminal 142.

Figure 8:
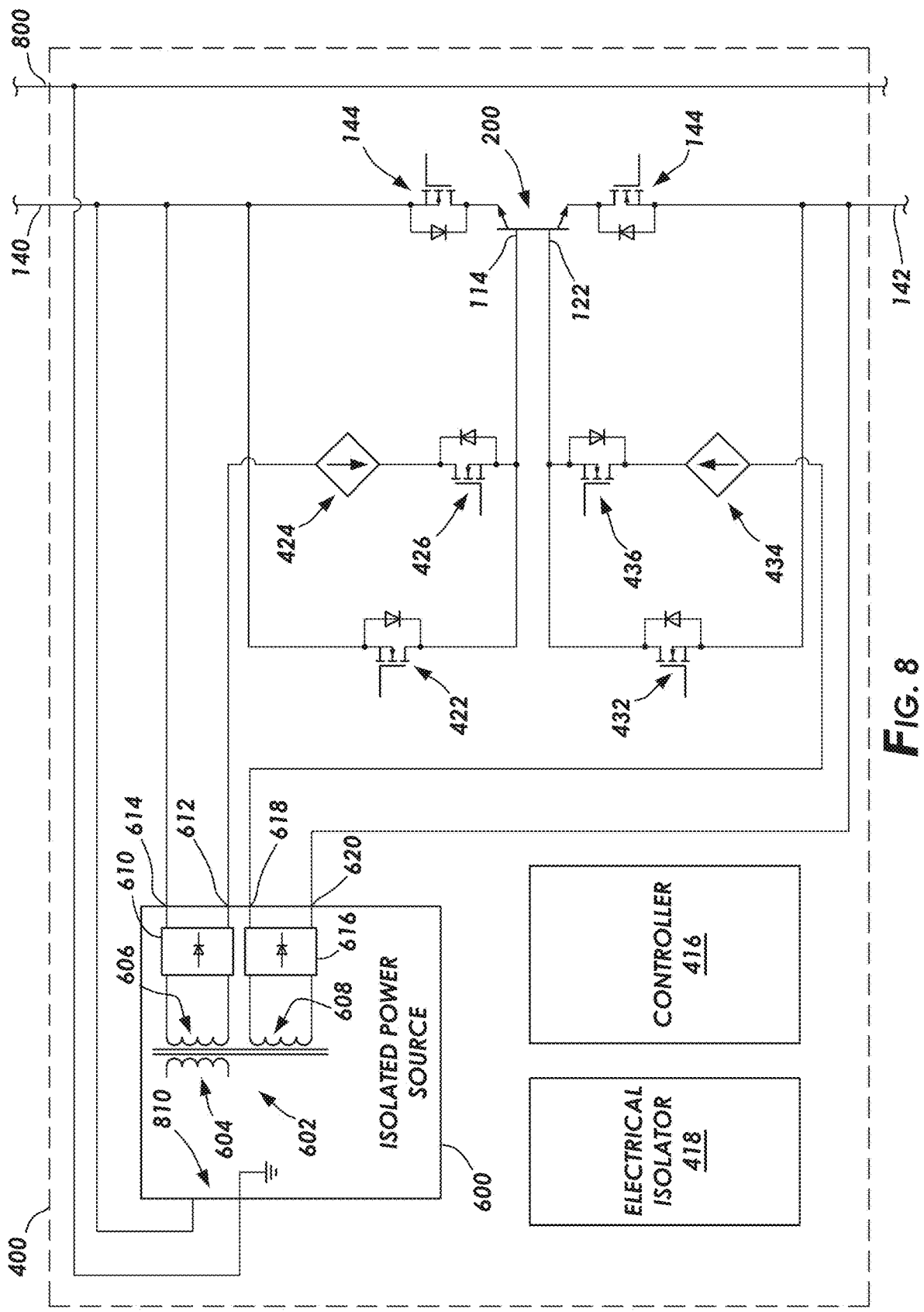
FIG. 8 shows partial schematic, partial block diagram, of an example switch assembly in accordance with at least some embodiments.

FIG. 8 shows partial schematic, partial block diagram, of an example switch assembly 400. In some case, the switch assemblies are powered by a source of power separate and distinct from the controlled power flowing through the terminals 140 and 142 of the switch assembly 400. In other cases, and as shown in FIG. 8, the switch assembly may derive operational power from the controlled power. To that end, the example isolated power source 600 defines a power input 810 coupled to the upper terminal 140 and the neutral or ground 800. While FIG. 8 shows the ground 800 traversing the switch assembly 400, in other cases the ground may be external to the switch assembly 400. The example isolated power source 600 thus derives operational power from the controlled power. As alluded to in the discussion above, the voltages and currents of the controlled power may be with respect to a different neutral or ground than the returns on the secondary side of the transformer 602 which enable the upper current source 424 and lower current source 434 to drive charge carriers into the respective bases relative to the voltages on the respective collector-emitters. Thus, the neutral connection to the isolated power source 600 is shown to be a ground connection.

Figure 9:
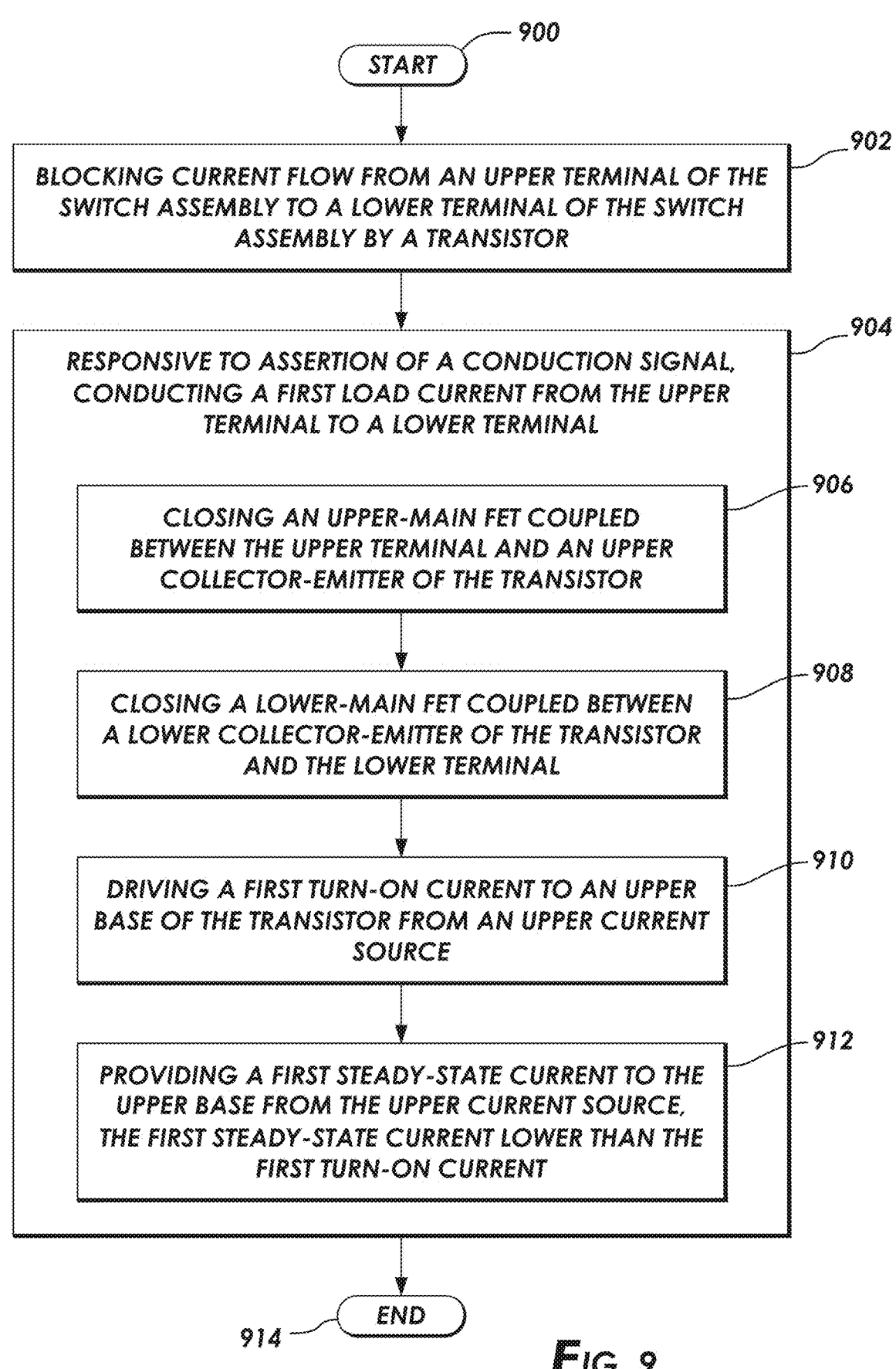
FIG. 9 shows a method in accordance with at least some embodiments.

FIG. 9 shows a method in accordance with at least some embodiments. In particular, the method starts (block 900) and comprises: blocking current flow from an upper terminal of the switch assembly to a lower terminal of the switch assembly by a transistor (block 902); and then responsive to assertion of a conduction signal, conducting a first load current from the upper terminal to a lower terminal (block 904). The conducting the first load current from the upper terminal to the lower terminal (again block 904) may be by: closing an upper-main FET coupled between the upper terminal and an upper collector-emitter of the transistor (block 906); closing a lower-main FET coupled between a lower collector-emitter of the transistor and the lower terminal (block 908); driving a first turn-on current to an upper base of the transistor from an upper current source (block 910); and then providing a first steady-state current to the upper base from the upper current source, the first steady-state current lower than the first turn-on current (block 912). Thereafter, the method ends (block 914), likely to be restarted, such as with current flowing in the opposite direction.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s). Moreover, this paragraph shall not negate that a base electrically connected to a collector-emitter through a transistor may be referred to as "directly coupled."

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating a switch assembly, the method comprising:

blocking current flow from an upper terminal of the switch assembly to a lower terminal of the switch assembly by a transistor; and then, responsive to assertion of a conduction signal, conducting a first load current from the upper terminal to a lower terminal by:

closing an upper-main FET coupled between the upper terminal and an upper collector-emitter of the transistor;

closing a lower-main FET coupled between a lower collector-emitter of the transistor and the lower terminal;

driving a first turn-on current to an upper base of the transistor from an upper current source; and then providing a first steady-state current to the upper base from the upper current source, the first steady-state current lower than the first turn-on current, wherein driving the first turn-on current from the upper current source comprises driving the first turn-on current from an upper power converter based on a first upper feedback derived from an output voltage of the upper power converter, and wherein providing the first steady-state current from the upper current source comprises providing the first steady-state current from the upper power converter based on a second upper feedback derived from current provided by the upper power converter.

2. The method of claim 1 further comprising interrupting the first load current by opening the lower-main FET, and then arranging the transistor to block current from the upper terminal to the lower terminal.

3. The method of claim 2 further comprising:

blocking current flow from the lower terminal to the upper terminal by the transistor; and then responsive to assertion of a conduction signal conducting a second load current from the lower terminal to the upper terminal by:

closing the lower-main FET;

closing the upper-main FET;

driving a second turn-on current to a lower base of the transistor from a lower current source; and then providing a second steady-state current to the lower base from the lower current source, the second steady-state current lower than the second turn-on current.

4. The method of claim 3 wherein the first steady-state current is equal to the second steady-state current.

5. The method claim 3:

wherein driving the second turn-on current from the lower current source comprises driving the second turn-on current from a lower power converter based on a first lower feedback derived from an output voltage of the lower power converter; and wherein providing the second steady-state current from the lower current source comprises providing the second steady-state current from the lower power converter based on a second lower feedback derived from current provided by the lower power converter.

6. The method of claim 3 further comprising extracting energy for the first turn-on current and the first steady-state current from the upper terminal, and extracting energy for the second turn-on current and the second steady-state current from the upper terminal.

24

7. The method claim 1:

wherein driving the first turn-on current from the upper current source comprises driving the first turn-on current from an upper power converter based on a first setpoint; and wherein providing the first steady-state current from the upper current source comprises driving the first steady-state current from the upper power converter based on a second setpoint different than the first setpoint.

8. The method of claim 1 further comprising extracting energy for the first turn-on current and the first steady-state current from the upper terminal.

9. A switch assembly comprising:

an upper terminal, and a lower terminal;

a transistor defining an upper base, an upper collector-emitter, a lower base, and a lower collector-emitter;

an upper current source having a sink input coupled to the upper terminal and a source output;

an upper-main FET defining a first lead coupled to the upper terminal, a second lead coupled to the upper collector-emitter, and a gate;

a lower-main FET defining a first lead coupled to the lower collector-emitter, a second lead coupled to the lower terminal, and a gate; and a controller coupled to the gate of the upper-main FET and the gate of the lower-main FET, and for a first applied voltage across the upper terminal and lower terminal, the controller configured to:

assert the gate of the upper-main FET;

assert the gate of the lower-main FET;

configure the upper current source to provide a first turn-on current to the upper base of the transistor by driving the first turn-on current from an upper power converter based on a first upper feedback derived from an output voltage of the upper power converter, and then to provide a first steady-state current to the upper base by providing the first steady-state current from the upper power converter based on a second upper feedback derived from current provided by the upper power converter, the first steady-state current lower than the first turn-on current.

10. The switch assembly of claim 9 further comprising:

an upper-base FET defining a first lead coupled to the source output of the upper current source, a second lead coupled to the upper base, and a gate;

wherein the controller is coupled to the gate of the upper-base FET, and when the controller configures the upper current source, the controller is configured to assert the gate of the upper-base FET to couple the source output to the upper base.

11. The switch assembly of claim 9 further comprising:

a lower current source having a sink input coupled to the lower terminal and a source output;

wherein, for a second applied voltage across the upper terminal and lower terminal, the second applied voltage of opposite polarity from the first applied voltage, the controller configured to:

assert the gate of the lower-main FET;

assert the gate of the upper-main FET; and configure the lower current source to provide a second turn-on current to the lower base of the transistor by driving the second turn-on current from a lower power converter based on a first lower feedback derived from an output voltage of the lower power converter, and then to provide a second steady-state current to the lower base by providing the second steady-state current from the lower power converter based on a second lower feedback derived from current provided by the lower power converter, the second steady-state current lower than the second turn-on current.

12. The switch assembly of claim 11 wherein the upper current source is a switching power converter designed and constructed to control output current as a controlled variable during at least the providing of the first steady-state current.

13. The switch assembly of claim 11 wherein the upper current source is a switching power converter designed and constructed to control output current as a controlled variable during the providing of the first turn-on current and during the providing of the first steady-state current.

14. The switch assembly of claim 11 further comprising:

an upper-base FET defining a first lead coupled to the source output of the upper current source, a second lead coupled to the upper base, and a gate; and a lower-base FET defining a first lead coupled to the source output of the lower current source, a second lead coupled to the lower base, and a gate, wherein the controller is coupled to the gate of the upper-base FET and the gate of the lower-base FET, when the controller configures the upper current source, the controller is configured to assert the gate of the upper-base FET to couple the source output of the upper current source to the upper base, and when the controller configures the lower current source, the controller is configured to assert the gate of the lower-base FET to couple the source output of the lower current source to the lower base.

\* \* \* \* \*